(12) United States Patent
Hirler et al.

(10) Patent No.: US 9,166,028 B2
(45) Date of Patent: Oct. 20, 2015

(54) CIRCUIT CONFIGURED TO ADJUST THE ACTIVATION STATE OF TRANSISTORS BASED ON LOAD CONDITIONS

(75) Inventors: Franz Hirler, Isen (DE); Martin Feldtkeller, Munich (DE); Gerald Deboy, Klagenfurt (DE)

(73) Assignee: Infineon Technologies Austria AG, Villach (AT)

( * ) Notice: Subject to any disclaimer, the term of this patent is extended or adjusted under 35 U.S.C. 154(b) by 129 days.

(21) Appl. No.: 13/118,993

(22) Filed: May 31, 2011

(65) Prior Publication Data

US 2012/0306464 A1 Dec. 6, 2012

(51) Int. Cl.
| | |
|---|---|
| G05F 1/00 | (2006.01) |
| H01L 29/739 | (2006.01) |
| H01L 27/088 | (2006.01) |
| H01L 29/78 | (2006.01) |
| H03K 17/0412 | (2006.01) |
| H03K 17/687 | (2006.01) |
| H01L 21/8234 | (2006.01) |
| H01L 29/06 | (2006.01) |
| H01L 29/40 | (2006.01) |

(52) U.S. Cl.
CPC .......... *H01L 29/7397* (2013.01); *H01L 27/088* (2013.01); *H01L 29/7813* (2013.01); *H03K 17/04123* (2013.01); *H03K 17/6871* (2013.01); H01L 21/823487 (2013.01); H01L 29/0634 (2013.01); H01L 29/0653 (2013.01); H01L 29/407 (2013.01)

(58) Field of Classification Search
CPC ........... H01L 29/7813; H01L 29/7801; H03K 17/04123; H02M 3/156; H02M 2001/0045; H02M 3/158; H02M 3/1584

USPC .......... 323/217, 266, 268, 282; 257/330, 332, 257/334, E29.256; 327/434
See application file for complete search history.

(56) References Cited

U.S. PATENT DOCUMENTS

| | | | | |
|---|---|---|---|---|
| 5,063,338 A | * | 11/1991 | Capel et al. | 323/268 |
| 5,459,339 A | * | 10/1995 | Sakurai et al. | 257/167 |
| 5,616,945 A | * | 4/1997 | Williams | 257/365 |

(Continued)

FOREIGN PATENT DOCUMENTS

| | | |
|---|---|---|
| CN | 1165435 A | 11/1997 |
| CN | 101960700 A | 1/2011 |

(Continued)

OTHER PUBLICATIONS

U.S. Appl. No. 12/873,146, filed Aug. 31, 2010, titled "Circuit Arrangement with an Adjustable Transistor Component", Applicant: Infineon Technologies Austria AG, Inventors: Hirler,, Dr. Franz; Mauder, Dr. Anton; Pfirsch, Dr. Frank.

(Continued)

*Primary Examiner* — Adolf Berhane
*Assistant Examiner* — Alex Torres-Rivera
(74) *Attorney, Agent, or Firm* — Murphy, Bilak & Homiller, PLLC

(57) ABSTRACT

Disclosed is a circuit arrangement, including a transistor component with a gate terminal, a control terminal, and a load path between a source and a drain terminal, and a drive circuit connected to the control terminal and configured to determine a load condition of the transistor component, to provide a drive potential to the control terminal, and to adjust the drive potential dependent on the load condition.

22 Claims, 8 Drawing Sheets

(56) References Cited

U.S. PATENT DOCUMENTS

| | | | |
|---|---|---|---|
| 5,825,215 A | 10/1998 | Sugio et al. | |
| 6,269,011 B1* | 7/2001 | Ohshima | 363/50 |
| 7,504,868 B2* | 3/2009 | Bodano et al. | 327/108 |
| 8,067,929 B2 | 11/2011 | Huang et al. | |
| 8,093,655 B2 | 1/2012 | Hirler et al. | |
| 2008/0024012 A1 | 1/2008 | Qahouq et al. | |
| 2008/0030178 A1* | 2/2008 | Leonard et al. | 323/282 |
| 2008/0224738 A1 | 9/2008 | Bodano et al. | |
| 2009/0146628 A1* | 6/2009 | Nakahara | 323/282 |
| 2009/0189216 A1* | 7/2009 | Werner et al. | 257/328 |
| 2009/0218621 A1* | 9/2009 | Pfirsch et al. | 257/342 |
| 2009/0218708 A1 | 9/2009 | Fisher et al. | |
| 2009/0218998 A1* | 9/2009 | Huang et al. | 323/282 |
| 2009/0278518 A1* | 11/2009 | Takagi | 323/282 |
| 2009/0289690 A1 | 11/2009 | Hirler et al. | |
| 2010/0078713 A1* | 4/2010 | Mauder et al. | 257/330 |
| 2010/0084706 A1* | 4/2010 | Kocon | 257/334 |
| 2012/0049898 A1* | 3/2012 | Mauder et al. | 327/109 |

FOREIGN PATENT DOCUMENTS

| | | |
|---|---|---|
| DE | 102006026943 A1 | 12/2007 |
| DE | 10 2009 022 032 A1 | 4/2010 |

OTHER PUBLICATIONS

U.S. Appl. No. 12/868,918, filed Aug. 26, 2010, titled "Depletion MOS Transistor and Charging Arrangement", Applicant: Infineon Technologies Austria AG, Inventors: Hirler, Dr. Franz; Mauder, Dr. Anton; Weyers, Dr. Joachim; Pfirsch, Dr Frank.

* cited by examiner

CIRCUIT CONFIGURED TO ADJUST THE ACTIVATION STATE OF TRANSISTORS BASED ON LOAD CONDITIONS

TECHNICAL FIELD

Embodiments of the present application relate to a circuit arrangement with an adjustable transistor component, in particular a transistor component with a gate terminal and a further control terminal, and to a method for driving a transistor component.

BACKGROUND

Transistor components, like MOSFETs, are widely used as electronic switches in the industrial and automotive area. MOSFETs can be operated at high switching frequencies and, compared to relays, have a small size.

However, losses occur when a MOSFET is operated. These losses mainly include (a) ohmic losses and (b) capacitive losses and occur as follows:

(a) Although MOSFETs can be operated at high switching frequencies, they do not switch on or off abruptly, but they gradually change between an on-state, in which an ohmic resistance of the MOSFET assumes its minimum value, and an off-state, in which the MOSFET blocks and prevents a current flow. The minimum value of the ohmic resistance of an MOSFET is also known as on-resistance. Ohmic losses occur when the MOSFET is in its on-state and are due to the MOSFETs on-resistance. When the MOSFET changes its operation state from the on-state to the off-state, or vice versa, switching losses occur additionally during these transition phases. In many applications, the switching losses dominate the total MOSFET losses at low load currents.

(b) Further, a MOSFET includes a voltage dependent output capacitance (usually referred to as $C_{OSS}$) which usually includes a drain-source capacitance $C_{DS}$ between its drain and source terminals and a gate-drain capacitance $C_{GD}$ between its gate and drain terminals. When the MOSFET transitions from the on-state to the off-state, the output capacitance is charged, i.e. energy is stored in the output capacitance; the output capacitance is discharged, when the MOSFET transitions from the off-state to the on-state. The output energy $E_{OSS}$, which is the energy stored in the output capacitance, is mainly dependent on the voltage across the drain-source path when the MOSFET is in its off-state and is dependent on the capacitance value of the output capacitance. The energy stored in the output capacitance defines the capacitive losses of the MOSFET. In many applications, the capacitive losses dominate the switching losses under typical load conditions.

The ohmic losses are proportional to the square of the load current, while the capacitive losses do not depend on the load current. Therefore, dependent on the specific load conditions, the ohmic losses or the capacitive losses may prevail. For example, when a load connected to the MOSFET draws a low load current, so that a low current flows through the MOSFET in its on-state, the capacitive losses may mainly determine the overall losses. Whereas, when the load draws a high load current, the ohmic losses and switching losses during transition phases may mainly determine the overall losses. The switching losses during transition phases and the capacitive losses are directly proportional to the switching frequency of the device.

In addition, the output charge $Q_{OSS}$, which is the charge stored in the output capacitance, is important for some applications. E.g., the turn off delay time of the MOSFET at low load currents is dominated by the output charge. This is the charge which has to be stored in the output capacitance before the transistor is completely turned off. This output charge is provided by the load current. Therefore, the turn off delay time increases inversely proportional with decreasing load current.

There is, therefore, a need to provide a circuit arrangement with a transistor component, in particular a MOSFET, in which dependent on the load conditions the losses and turn off delay time can be minimized.

SUMMARY

A first aspect relates to a circuit arrangement including a transistor arrangement including a plurality of n transistors, with n≥2, each having a gate terminal, and a load path between a source and a drain terminal, and m, with m≤n and m≥1 of the n transistors having a control terminal. The control terminal of each of the transistors is configured to receive a control signal that adjusts an activation state of the transistor. The load paths of the plurality of n transistors are connected in parallel forming a load path of the transistor arrangement. A drive circuit is configured to adjust the activation state of the m transistors comprising a control terminal independent of the others of the plurality of transistors to one of a first and second activation state, to determine a load condition of the transistor arrangement, and to select k, with k≥0, transistors that are driven to assume the first activation state and m−k transistors that are driven to assume the second activation state dependent on the load condition.

A second aspect relates to a switching converter including input terminals for applying an input voltage, output terminals for providing an output voltage, a rectifier-inductor arrangement coupled between the input terminals and the output terminals, and a control circuit configured to receive an output voltage signal that is dependent on the output voltage, to provide a drive signal, and to assume one of at least two different operation modes. A transistor arrangement includes a plurality of n transistors, with n≥2, each including a gate terminal, and a load path between a source and a drain terminal, and at least m, with m≤n and m≥ of the n transistors including a control terminal wherein the control terminal of each of the m transistors is configured to receive a control signal that adjusts an activation state of the transistor, and wherein the load paths of the plurality of n transistors are connected in parallel forming a load path of the transistor arrangement. A drive circuit is configured to adjust the activation state of the m transistors including a control terminal independent of the others of the plurality of transistors to one of a first and second activation state, to determine a load condition of the transistor arrangement, and to select k, with k≥0, transistors that are driven to assume the first activation state and m−k transistors that are driven to assume the second activation state dependent on the operation mode of the control circuit. Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic

FIG. 12 that includes

DETAILED DESCRIPTION

Figure 1:
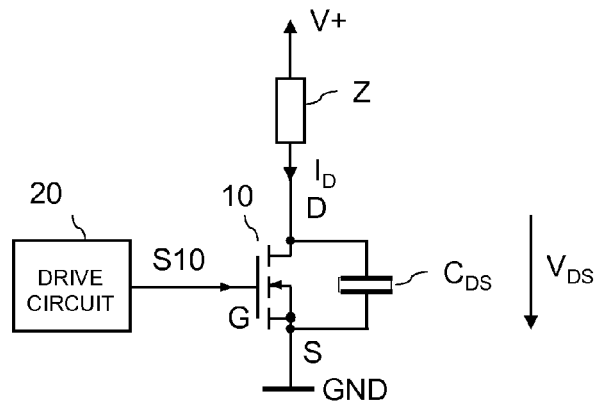
FIG. 1 shows a circuit arrangement which illustrates the use of a transistor component for switching a load current.

In order to ease a better understanding of embodiments which will be explained herein further below, the use of a transistor component as an electronic switch will be explained with reference to FIG. 1. FIG. 1 shows a circuit diagram with a transistor component 10 that acts as an electronic switch which switches a current through a load Z. The transistor component 10, which in the example of FIG. 1 is implemented as a MOSFET, includes a gate terminal G which is configured to receive a drive signal S10 from a drive circuit 20, and a load path. The load path, which can also be referred to as internal load path, extends within the transistor between a drain and a source terminal D, S. The load path D–S is connected in series with a load Z, with the series circuit with the transistor 1 and the load Z being connected between terminals for a first and a second supply potential V+, GND.

The load Z can be a resistive load such as e.g. a filament bulb, an inductive load such as a coil, a transformer or an induction motor, or a capacitive load.

The transistor 10 can be switched on and off by the drive circuit 20 that generates a suitable drive signal S10 at the gate terminal G of the transistor 10. The drive signal is, for example, a pulsewidth-modulated (PWM) signal. This is commonly known, so that no further explanations are required in this regard.

When the MOSFET is switched on, i.e. when the MOSFET is in its on-state, a load current $I_D$ flows through the load Z and the load path of the transistor 10, where the magnitude of the load current $I_D$ is mainly defined by the supply voltage present between the terminals for the first and second supply potential V+, GND and by the characteristic of the load Z. When the transistor 10 is in its on-state, ohmic losses occur in the transistor 10. These losses result from the on-resistance of the transistor 10 and the load current $I_D$ flowing through the transistor 10. When the MOSFET changes its operation state from the on-state to the off-state, i.e. when the MOSFET is switched off, or vice versa, losses increase for a short time interval. This is due to the simultaneous presence of high currents and high voltages at the load terminals D, S of the transistor 10 in transition phases between the on-state and the off-state.

Figure 2:
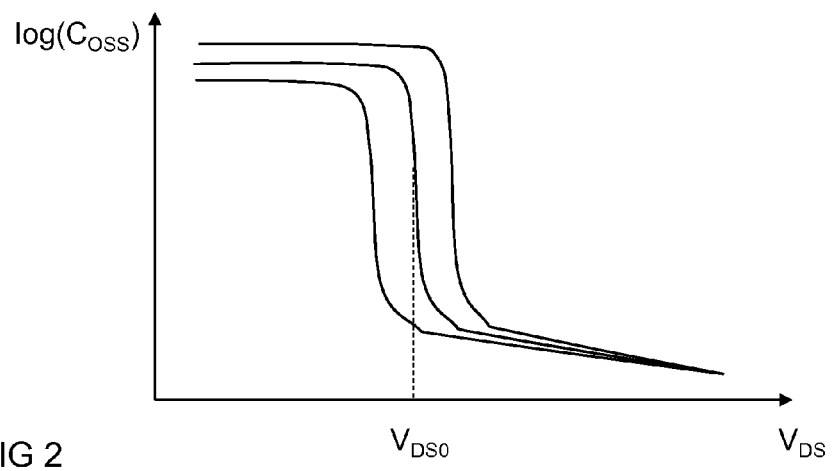
FIG. 2 schematically illustrates the voltage-dependency of an output capacitance of a transistor component.

Transistor components, in particular MOSFETs, include an output capacitance which is effective between the drain and the source and the drain and the gate terminals and usually includes a drain-source capacitance $C_{DS}$ between the drain and the source terminals D, S and a gate-drain $C_{GD}$ capacitance between the gate and the drain terminal. In FIG. 1, the drain-source capacitance $C_{DS}$ is schematically illustrated. It should be noted in this connection that the drain-source capacitance and the drain-gate capacitance can be regarded to be connected in parallel in a small-signal equivalent circuit diagram. A capacitance value $C_{OSS}$ of the output capacitance is dependent on the voltage between the drain and source terminals D, S of the transistor. The dependency of this capacitance value $C_{OSS}$ on the voltage $V_{DS}$ between the drain and source terminals D, S is schematically illustrated in FIG. 2.

When the transistor 10 is switched off and the voltage $V_{DS}$ across the load path of the transistor 10 increases, the output capacitance is charged, i.e. energy is stored in the output capacitance. Equivalently, the output capacitance is discharged when the MOSFET is switched on. Charging the output capacitance when the MOSFET is switched off, and discharging the output capacitance when the MOSFET is switched on causes losses, which will be referred to as capacitive losses in the following.

Losses that occur when the transistor component 10 is operated in a switched-mode, i.e. when the transistor component 10 is cyclically switched on and off, include ohmic losses, switching losses during transition phases, and capacitive losses. Which of these losses prevails is dependent on the load condition of the transistor component 10. The load condition of the transistor component 10 is mainly defined by the load current $I_D$ flowing through the transistor 10 in its on-state, but is also defined by the switching frequency at which the transistor 10 is switched on and off.

The capacitive losses are dependent on the energy which is stored in the output capacitance when the transistor 10 is switched off. This energy is dependent on the capacitance value $C_{OSS}$ of the output capacitance and the maximum voltage across the load path of the transistor 10 when the transistor is in its off-state.

There are transistor components in which the capacitance value $C_{OSS}$ of the output capacitance is dependent on the voltage across the load path of the transistor. FIG. 2 schematically illustrates such voltage-dependency of the output capacitance value $C_{OSS}$ on the voltage across the transistor. In FIG. 2, $C_{OSS}$ denotes the output capacitance value, and $V_{DS}$ denotes the voltage between the drain and source terminals D, S of the transistor. As can be seen from FIG. 2, there is a voltage $V_{DS0}$ at which the output capacitance value $C_{OSS}$ significantly decreases when the voltage $V_{DS}$ increases.

The voltage $V_{DS0}$ can be dependent on several factors. In FIG. 2, besides the curve in which the output capacitance value $C_{OSS}$ rapidly decreases at $V_{DS0}$, two further curves are shown in which the capacitance value rapidly decreases at a voltage higher than $V_{DS0}$ and rapidly decreases at a voltage lower than $V_{DS0}$, respectively. The $V_{DS0}$ voltage can be dependent on the maximum capacitance value, which occurs at low drain-source voltages $V_{Ds}$. According to one embodiment, the $V_{DS0}$ voltage decreases with decreasing maximum capacitance value $C_{OSS}$.

The energy $E_{OSS}$ stored in the output capacitance is given by:

$$E_{OSS} = \int_{V_{DSon}}^{V_{DSeff}} C_{OSS}(V_{DS})V_{DS}dV_{DS} \quad (1a)$$

where $V_{DSon}$ is the voltage across the load path when the transistor 10 is in its on-state, and $V_{DSoff}$ is the voltage across the load path when the transistor 10 is in its off-state. $C_{OSS}$ ($V_{DS}$) is the output capacitance value which is dependent on the voltage $V_{DS}$. Since the voltage $V_{DSon}$ across the transistor 10 in its on-state is, usually, very low and significantly lower than the voltage $V_{DSoff}$ in the off-state, equation (1a) can be simplified to $$E_{OSS} = \int_{0}^{V_{DSeff}} C_{OSS}(V_{DS})V_{DS}dV_{DS}, \quad (1b)$$

It can be seen from FIG. 2 and from equations (1a) or (1b), respectively, that the energy $E_{OSS}$ stored in the output capacitance and, thus, the capacitive losses can be reduced by decreasing the voltage value $V_{DS0}$ at which the output capacitance value $C_{OSS}$ decreases as well as by reducing the plateau-value, i.e. the maximum capacitance value, at low $V_{DS}$.

Three embodiments of transistor components which have a voltage-dependent output capacitance and in which the voltage-dependency of the output capacitance can be adjusted will now be explained with reference to FIGS. 3, 5 and 6. It should be noted that FIGS. 3, 5 and 6 only schematically illustrate three different types of transistor components with voltage-dependent output capacitances. The transistor components illustrated in FIGS. 3, 5 and 6 can be modified in many different ways. Further, other types of transistor components with voltage-dependent output capacitances exist which can be used in connection with the embodiments described herein.

Figure 3:
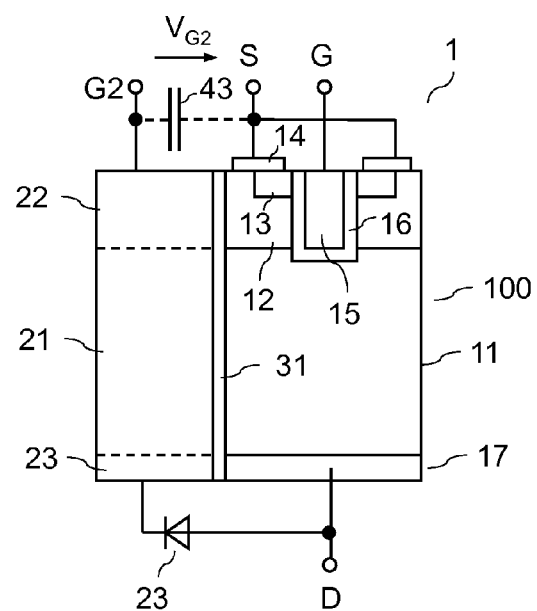
FIG. 3 schematically illustrates a first embodiment of a transistor component which has a voltage-dependent output capacitance.

The transistor component 1 illustrated in FIG. 3 is implemented as a MOSFET and includes a source region 13 connected to a source terminal S, and a drain region 17 connected to a drain terminal D. The MOSFET further includes a drift region 11 and a body region 12. The body region 12 is arranged between the source region 13 and the drift region 11, and the drift region 11 is arranged between the body region 12 and the drain region 17. The source region 13, the body region 12, the drift region 11 and the drain region 17 are integrated in a semiconductor body 100. The MOSFET according to FIG. 3 is implemented as a vertical MOSFET, which is a MOSFET in which the source region 13 and the drain region 17 are arranged distant to one another in a vertical direction of the semiconductor body 100 In this case, a current essentially flows in a vertical direction through the semiconductor body 100 when the MOSFET is in its on-state. However, implementing the MOSFET as a vertical MOSFET is only an example. The basic principle explained below is also applicable to lateral MOSFETs in which the source and the drain regions are arranged distant to one another in a lateral direction of a semiconductor body.

The source region 13 and the body region 12 are both connected to a source electrode 14, with the source electrode 14 being connected to the source terminal S. This is common practice in MOSFETs.

The MOSFET further includes a gate electrode 15 connected to a gate terminal G. The gate electrode 15 is arranged adjacent to the body region 17. A gate dielectric 16 is arranged between the gate electrode 15 and the body region 12. In a commonly known manner the gate electrode 15 serves to control a first conducting channel in the body region 12 between the source region 13 and the drift region 11. In the embodiment illustrated in FIG. 3, the gate electrode 15 is a trench-electrode, i.e. the gate electrode 15 is arranged in a trench of the semiconductor body 100. However, this is only an example. The gate electrode 15 could also be implemented as a planar electrode on top of the semiconductor body 100.

The MOSFET is in its on-state, when an electrical potential applied to the gate terminal G is suitable for generating a first conducting channel along the gate dielectric 16 in the body region 12, and the MOSFET is in its off-state, when there is no suitable drive potential at the gate terminal 15 for generating a conducting channel along the gate dielectric 16.

The MOSFET can be implemented as an enhancement MOSFET. In this case, the body region 12 is doped complementarily to the source region 13. The first conducting channel generated in the body region 12 controlled by the gate electrode 15 is an inversion channel in this case. Further, the MOSFET can be implemented as an n-type or as a p-type MOSFET. In an n-type MOSFET the source region 13 and the drain region 17 are n-doped, while in a p-type MOSFET the source region 13 and the drain region 17 are p-doped.

The MOSFET according to FIG. 3 further includes a drift control region 21 which is arranged adjacent to the drift region 11 and which is dielectrically insulated from the drift region 11 by a drift control region dielectric 31. The drift control region 21 includes a monocrystalline semiconductor material and serves to generate a second conducting channel in the drift region 11 along the drift control region dielectric 31 when the MOSFET is in its on-state. This conducting channel helps to decrease the on-resistance of the MOSFET. When the MOSFET is in its on-state the load current in the drift region 11 mainly flows through the second conducting channel along the drift control region dielectric 31. Like in a conventional MOSFET the doping type of the drift region 11 can correspond to the doping types of the source and the drain regions 13, 17. In this case the conducting channel along the drift control region dielectric 31 is an accumulation channel.

However, unlike conventional MOSFETs, the drift region 11 partly or completely could also be doped complementarily to the source and the drain regions 13, 17. When the gate dielectric 16 and the drift control region dielectric 31 are arranged distant to one another in a horizontal direction, so that a conducting channel in the body region 12 and a conducting channel along the drift control region dielectric 31 are arranged distant to one another in the horizontal direction, the drift region 11 should include a least one section which has the same doping typing as the source region 13 and which extends from the first channel region at the gate dielectric 16 to the second channel region at the drift control region dielectric 31.

The doping type of the drift control region 21 can correspond to the doping type of the drift region 11, and can be complementarily to the doping type of the drift region 11. Further, the drift region 11 could be implemented with two differently doped sections from which one has the doping type of the drift control region and the other one is doped complementarily.

To generate the second conducting channel in the drift region 11 along the drift control region dielectric 31 a positive electrical potential of the drift control region 21 relative to the electrical potential of the drift region 11 or relative to the electrical potential of the drain region 17 is required in an n-type component where the second conduction channel has an electron channel. For an n-type component the second conducting channel is an accumulation channel when the drift region 11 is n-doped, and is an inversion channel when the drift region 11 is p-doped. The drift control region 21 is coupled to a control terminal G2 at which a drive potential G2 required for generating the conducting channel in the drift region 11 can be provided to the drift region 21. Optionally, a capacitive storage element 43, like a capacitor can be connected between the control terminal G2 and the source terminal S. When, in an n-type MOSFET, the drift control region 21 is n-doped, a p-type semiconductor region 22 can be arranged between the control terminal G2 and the drift region 21. This p-type region 22 delivers the positive charge carriers (holes) which are required to charge the drift region 21 to the positive potential required for generating the second conducting channel in the drift region 11 along the drift control region dielectric 31.

While the electrical potential at the gate terminal G of the MOSFET varies dependent on the desired operation state (on-state of off-state) of the MOSFET, the electrical potential at the control terminal G2 can be kept constant over the switching cycle or over a number of subsequent switching cycles. This electrical potential at the control terminal G2 can be constant relative to the electrical potential at the source terminal S.

The electrical potential at the control terminal G2 could also assume different values in the on-state and the off-state of the MOSFET, dependent on the capacitance 43 and depth and thickness of the dielectric layer 31. In this case the drive potential provided to the control terminal G2 can, e.g., be provided only during a part of the off-state or only during a part of the on-state by, e.g., charging or discharging the drift control zone 21 during this time. The potential at the control terminal G2 during the rest of the time is then determined by the transistor layout such as capacitance 43 and depth and thickness of the dielectric layer 31. This will again be explained herein further below.

When the MOSFET is switched off, i.e. when the conducting channel along the gate dielectric 16 is interrupted, and when a voltage is applied between the drain and source terminals (a positive voltage at the drain terminal in an n-type MOSFET and a negative voltage in a p-type MOSFET) a depletion zone expands in the drift region 11. This depletion zone, or the electric field associated with the depletion zone, also causes the drift control region 21 from being depleted of charge carriers, and the second conducting channel along the drift control region dielectric 31 is interrupted.

Referring to FIG. 3, the drift control region 21 is coupled to the drain terminal D via a rectifier element 23, like a diode. The rectifier element 23 is biased such that the electrical potential of the drift control region 21 can increase above the electrical potential of the drain terminal D. During the off-state of the component 1 the rectifier element 23 is biased in forward direction and the potential at that region of the drift control region 21 to which the diode 23 is connected is fixed at the potential of the drain terminal D minus the forward voltage drop of the rectifier element 23. Optionally, the drift control region 21 includes a higher doped contact region 25 to which the diode 23 is connected. Thus the rectifier element 23 helps to prevent the accumulation of thermally generated charge carriers in the drift region 21 when the component 1 is in its off-state.

The operating principle which has been explained for an n-type MOSFET hereinbefore also applies to a p-type MOSFET, wherein in a p-type MOSFET the individual semiconductor regions have a complementary doping type, the voltages have a reversed polarity, and polarity-dependent components, like diodes, have their terminals interchanged.

The MOSFET according to FIG. 3 has an output capacitance with an output capacitance value $C_{OSS}$ that has a characteristic according to FIG. 2 and which significantly decreases when the voltage reaches a threshold value $V_{DS0}$. The characteristic illustrated in FIG. 2 in which the output capacitance value $C_{OSS}$ has a high value for voltages below the threshold value $V_{DS0}$, and has a lower value for voltages above the threshold value $V_{DS0}$ is equivalent to the fact that at voltages lower than the threshold value $V_{DS0}$ a higher charge has to be provided to the load path of the transistor to increase the voltage across the load path for a given voltage value $V_{DS}$ than at higher voltages, i.e. voltages higher than the threshold voltage $V_{DS0}$. The capacitance value at lower voltages can be up to 100 times to 1000 times higher than the capacitance value at higher voltages. Thus, at lower voltages a charge for increasing the voltage for $V_{DS}$ is 100 times to 1000 times higher than the charge required at higher voltages. MOSFETs of the type illustrated in FIG. 3 can be designed to have a breakdown voltage of between 50V and 2000V (2 kV). The voltage $V_{DS0}$ at which the output capacitance decreases is, for example, between 5V and 50V for such MOSFETs.

The mechanism that causes explained voltage-dependency of the output capacitance value in the MOSFET according to FIG. 3 is now explained. When the MOSFET is in its on-state charge carriers are accumulated in the drift region 11 along the drift control region dielectric 31, where these charge carriers form the accumulation or inversion channel in the drift region 11. This accumulated charge exceeds the background charge—resulting from the basic doping—of the drift region 11 and includes electrons in case of an n-channel transistor. The same amount of charge of the opposite type builds up an accumulation or inversion channel in the drift control region 21. Both accumulated charge amounts are situated on both sides of the drift control region dielectric 31. In the on-state there is a capacitor with a huge capacitance $C_{DDCR}$ between the drain 17 and drift 11 region on the one side and the drift control region 21 on the other side. The drift control region dielectric 31 forms the capacitor dielectric of this capacitor. This capacitor lies in series with a voltage source (not shown in FIG. 3) connected to the control terminal G2 and the source terminal S and/or the optional capacitor 43 connected between the drift control region 21 and the source terminal S. The capacitor with the capacitance $C_{DDCR}$ significantly contributes to the drain-source capacitance $C_{DS}$ and, thus, significantly contributes to the output capacitance $C_{OSS}$. When the MOSFET is switched off, i.e. when the channel along the gate dielectric 16 is interrupted, these electrical excess charges accumulated along the drift control region dielectric 31 have to be removed from the drift region 11, before the voltage across the drift region 11 and, thus, the voltage between the drain and source terminals D, S, can significantly increase. When the charges accumulated along the drift control region dielectric 31 have been removed a depletion region expands in the drift region 11 and the voltage across the drift region 11 increases. At the time when the drain-source voltage $V_{DS}$ in the transition between the on-state and the off-state reaches the initial voltage of the drift control region 21, i.e. the voltage at the control terminal G2, the accumulation charges on both sides of the drift control region dielectric 31 vanish and thus the capacitor $C_{DDCR}$ built up by accumulation charges disappears. The slope of the decrease of the capacitance $C_{DDCR}$ is steep and occurs at a voltage $V_{DS0}$ shown in FIG. 2 which is close to the initial voltage $V_{G2}$ of the drift control region 21. When the depletion region expands in the drift region 11 also charge carriers are stored in the drift region 11, however, the amount of charge carriers required for increasing the voltage $V_{DS}$ for a given voltage difference $V_{DS}$ is significantly lower than the amount of charge carriers required for increasing the voltage $V_{DS}$ when charge carriers are still accumulated along the drift control region dielectric 31. In the MOSFET according to FIG. 3 the voltage $V_{DS0}$ (see FIG. 2) at which the output capacitance value $C_{OSS}$ significantly decreases is, therefore, the voltage at which the charge carriers accumulated along the drift control region dielectric 31 have been removed and at which the depletion region starts to expand in the drift region 11.

The threshold voltage $V_{DS0}$ at which the output capacitance value $C_{OSS}$ decreases, i.e. at which the charge carriers accumulated in the drift region 11 have been removed, as well as the maximum of the output capacitance value $C_{OSS}$, which occurs at low drain-source voltages $V_{DS}$, is dependent on the drive potential $V_{G2}$ applied to the drift control region 21, where the threshold voltage $V_{DS0}$ increases when the potential applied to the drift control region 21 increases. In other words, the amount of charge carriers accumulated along the drift control region dielectric 31 increases with increasing electrical potential $V_{G2}$ of the drift control region 21.

In a MOSFET of the type illustrated in FIG. 3, the drive potential $V_{G2}$ can be provided by a drive circuit (not shown in FIG. 3) 40 connected to the control terminal G2. When the electrical potential $V_{G2}$ at the control electrode G2 is supplied by a drive circuit 40 with a low internal impedance the slope of the decrease of $C_{OSS}$ is very steep and occurs right at the voltage $V_{DS0}$ shown in FIG. 2. In this case, the electrical potential at the control terminal G2 is approximately constant, charges that are removed from the drift control region 21 when the transistor transitions into the off-state flow into the drive circuit 40 and these charges are again provided by the drive circuit 40 when the transistor is switched on again.

When the electrical potential $V_{G2}$ at the control terminal is supplied by a drive circuit (not shown in FIG. 3) 40 with a higher internal impedance, an additional capacitor, like the capacitor 43 of FIG. 3, can be connected between the drift control region 21 or terminal G2 and, e.g., the source electrode S of the transistor. This capacitor 43 can be part of the drive circuit 40. When the drive circuit 40 has a higher impedance, charges from the drift control region 21 cannot flow back or cannot completely flow back into the drive circuit 40. In this case a decrease of the accumulation charge along the drift control region dielectric 31 leads to an increase of the charge of the capacitor 43, to an increase of the voltage across the terminals of capacitor 43 and, finally, to an increase of the potential at terminal G2. An increased voltage at the terminal G2 influences the voltage $V_{DS0}$ in such a manner that $V_{DS0}$ is also increased. By adjusting the capacitance 43 and the internal impedance of the drive circuit 40 connected to the control terminal G2 the slope with which the capacitance value $C_{OSS}$ decreases with increasing $V_{DS}$ can be adjusted.

The electrical potential $V_{G2}$ at the control terminal G2 may vary when the transistor transitions from the on-state to the off-state, or vice versa, wherein a potential difference or potential swing between the electrical potential in the on-state and the off-state can be dependent on the internal impedance of the drive circuit 40 which provides the drive potential $V_{G2}$ and a capacitance value of the capacitance 43. This potential swing automatically occurs, when the charges that are removed from the drift control region 21 when the transistor transitions into the off-state are not completely absorbed by the drive circuit but are buffered in the capacitance 43 until the transistor 1 is again switched on.

In case the drive potential $V_{G2}$ is generated such that potential swings can occur during one switching cycle which includes an on-state and an off-state, changes of the drive potential $V_{G2}$ through the drive circuit 40 are only performed either during the on-states or during the off-states, or even only during a part of the on-state or a part of the off-state. Otherwise, stability problems in controlling the drive potential $V_{G2}$ may occur. To adjust the drive potential $V_{G2}$ only during the on-state or the off-state or even only during a part of the on-state or off-state, the drive circuit 40 is, for example, configured to have a low output impedance only during those times in which the drive potential is to be adjusted, and has a high output impedance else. The high output impedance allows the electrical potential at the control terminal G2 to swing without loading the drive circuit 40. The drive potential the drive circuit 40 applies to the control terminal G2 during those times in which it has a low output impedance can be kept constant during the switching cycle or even during a plurality of switching cycles in order to avoid driving losses. This potential is only adapted dependent on the load conditions.

Figure 4:
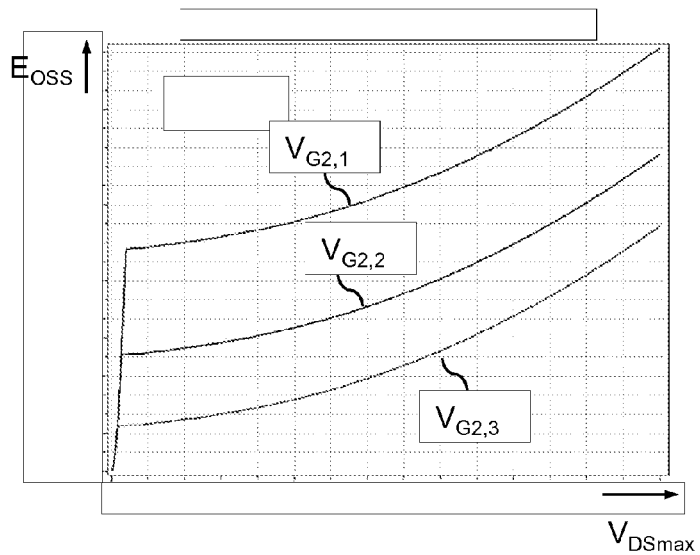
FIG. 4 schematically illustrates the energy stored in the output capacitance of a transistor component according to FIG. 3 dependent on a drive potential at a control terminal and dependent on a voltage across a load path of the transistor.

In the MOSFET according to FIG. 3, the electrical charge charged in the output capacitance when the MOSFET is switched off and the electrical energy $E_{OSS}$ stored in the output capacitance are, therefore, dependent on the electrical potential of the drift control region 21. FIG. 4 shows simulation results obtained for a MOSFET according to FIG. 3, wherein in FIG. 4 the electrical energy $E_{OSS}$ stored in the output capacitance dependent on the maximum drain-source-voltage at the terminals of the transistor when switching-off the transistor is shown. The energy $E_{OSS}$ is illustrated for three different potentials of the drift control region 21, which in the present example are $V_{G2,1}$=13V, $V_{G2,2}$=10V and $V_{G2,3}$=7V. In the present example, the electrical energy stored in the output capacitance was reduced for about 50% at the highest voltages $V_{DS}$ when the electrical potential $V_{G2}$ of the drift control region 21 was reduced from 13V to 7V. While the reduced $E_{OSS}$ is beneficial for the capacitive losses, the on-resistance ($R_{DSon}$) of the MOSFET increases when $V_{G2}$ is reduced from 13V to 7V. This is, however, negligible, when the MOSFET is switched under low load conditions. The on-resistance is the resistance between the drain and source terminals D, S when the MOSFET is in its on-state.

Dependent on the specific device, $V_{DS0}$ can be zero or negative. In this case, the drive potential $V_{G2}$ can be zero or negative.

Figure 5:
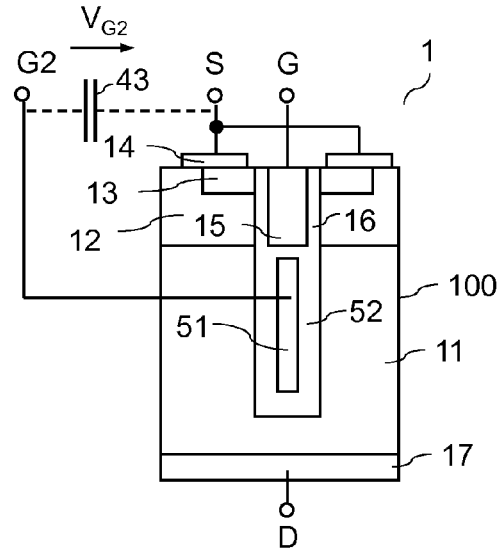
FIG. 5 schematically illustrates a second embodiment of a transistor component which has a voltage-dependent output capacitance.

FIG. 5 illustrates a further embodiment of a MOSFET with a voltage-dependent output capacitance value $C_{OSS}$. This MOSFET, instead of a drift control region 21 adjacent to the drift region 11, includes a field electrode 51. The field electrode 51 includes, for example a metal or a highly doped polycrystalline semiconductor material, like polysilicon. The field electrode 51 is arranged adjacent to the drift region 11 and is dielectrically insulated from the drift region 11 by a field electrode dielectric 52. The field electrode 52 is connected to the control terminal G2. In the embodiment illustrated in FIG. 5, the field electrode 51 is arranged below the gate electrode 15, where the gate electrode 15 and the field electrode 51 are arranged in a common trench of the semiconductor body 100 and are dielectrically insulated from one another. However, to arrange the gate electrode 15 and the field electrode 51 in the same trench is only an example. The field electrode 51 could also be arranged in a separate trench. Further, the gate electrode 51 can be implemented as a planar electrode arranged on the semiconductor body 100. The MOSFET illustrated in FIG. 5 is implemented as a vertical transistor. However, the MOSFET could be implemented as a lateral transistor as well. Further, arranging the gate electrode 15 in a trench is only an example. The gate electrode 15 could also be implemented as a planar electrode above a surface of the semiconductor body 100. This also applies to the MOSFET according to FIG. 3.

Like the MOSFET according to FIG. 3, the MOSFET according to FIG. 5 can be implemented as an enhancement MOSFET. In this case the body region 12 is doped complementarily to the source region 13 and the drain region 17. The MOSFET can be implemented as an n-type MOSFET or as a p-type MOSFET. In an n-type MOSFET the source and the drain regions 13, 17 as well as the drift region 11 are n-doped, while in a p-MOSFET the When the MOSFET is in operation a fixed drive potential or drive voltage can be applied to the control terminal G2. This drive voltage $V_{G2}$ is, for example, a voltage relative to the potential of the source terminal S. The operation state of the MOSFET is defined by the electrical potential at the gate terminal G, where this potential varies dependent on the desired operation state (on-state or off-state) of the MOSFET. In an n-type MOSFET the drive voltage $V_{G2}$ at the control terminal G2 is, for example, a positive voltage. When the MOSFET is in its on-state a first conducting channel is generated by the gate electrode 15 along the gate dielectric 16 in the body region 12. In an enhancement MOSFET this conducting channel is an inversion channel. Further, a second conduction channel, which is an accumulation channel, may be generated by the field electrode 51 in the drift region 11 along the field electrode dielectric 52 to further reduce the resistance of the typically low ohmic drift region 11.

When the MOSFET is switched off and the first conducting channel along the gate dielectric 16 is interrupted, the mechanism is the same as in the MOSFET according to FIG. 3, i.e. charge carriers that form the second conducting channel in the drift region 11 have to be removed before a depletion region expands in the drift region 11. In the MOSFET according to FIG. 5 the charge carriers that form the second conducting channel are accumulated along the field plate dielectric 52. Unlike the MOSFET according to FIG. 3, in which the electrical potential of the drift control region 21 increases when a depletion region expands in the drift region 11, the field electrode 51 can be kept on the drive potential $V_{G2}$ when the MOSFET is in its off-state. In this operation state the field electrode 51 partly "compensates" dopant charges in the drift region 11, so that the field electrode 51 at a given dopant concentration of the drift region 11 helps to increase the voltage blocking capability of the component.

Like in the device of FIG. 3, a capacitance 43 (illustrated in dashed lines) could be connected to the control terminal G2, and could, in particular be connected between the control terminal G2 and the source terminal S. In this case, the electrical potential at the control terminal G2 can also have different values in on- and off-state of the MOSFET, dependent on the capacitance 43 and depth and thickness of the dielectric layer 52. The drive potential provided to the control terminal G2 can e.g. be provided only during a part of the off-state or only during a part of the on-state by e.g. charging or discharging the drift control zone during this time. The potential at the control terminal during the rest of the time is then determined by the transistor layout such as the capacitance 43 and the depth and the thickness of the dielectric layer 52. The capacitance 43 can be an external capacitance or can be integrated within the semiconductor body 100.

Like in the MOSFET according to FIG. 3 the electrical energy stored in the output capacitance increases with increasing drive potential $V_{G2}$ at the control terminal G2.

Figure 6:
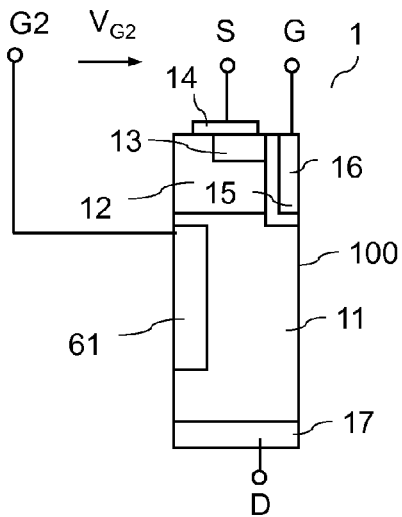
FIG. 6 schematically illustrates a third embodiment of a transistor component which has a voltage-dependent output capacitance.

FIG. 6 illustrates a further embodiment of a MOSFET with a voltage-dependent output capacitance value $C_{OSS}$. This MOSFET is implemented as a so-called "superjunction MOSFET" and instead of a drift control region 21 adjacent the drift region 11, like in the component of FIG. 3, includes a compensation region 61 in the drift region 11. The compensation region 61 is doped complementarily to the drift region 11, where a pn-junction is formed between the compensation region 61 and the drift region 11.

The compensation region 61 is separated from the body region 12 and is connected to the control terminal G2. In this context "separated" means that the compensation region 61 does not adjoin the body region 12. This allows the compensation region 61 to assume another electrical potential than the body region 12. In the embodiment illustrated in FIG. 6, a section of the drift region 11 is arranged between the compensation region 61 and the body region 12. However, other means for separating the compensation region 61 and the body region 12 like dielectric layers may be used as well.

In an n-type MOSFET, the drive potential $V_{G2}$ applied at the control terminal G2 is negative (including zero) relative to the source potential, while in a p-type MOSFET, the drive potential $V_{G2}$ is positive (including zero) relative to the source potential.

The MOSFET illustrated in FIG. 6 is implemented as a vertical trench transistor. In this type of transistor, the source region 13 and the drain region 17 are arranged distant to each other in a vertical direction of the semiconductor 100, and the gate electrode 15 is arranged in a trench of the semiconductor body 100. However, the transistor could also be implemented as a lateral transistor as well. Further, arranging the gate electrode 15 in a trench is only an example. The gate electrode 15 could also be implemented as a planar electrode (not shown) above a surface of the semiconductor body 100.

Like the MOSFETs according to FIGS. 3 and 5, the MOSFET according to FIG. 6 can be implemented as an enhancement MOSFET. In this case the body region 12 is doped complementarily to the source region 13 and the drain region 17. The MOSFET can be implemented as an n-type MOSFET or as a p-type MOSFET. In an n-type MOSFET the source and the drain regions 13, 17 as well as the drift region 11 are n-doped, while in a p-MOSFET the source region 13, drain region 17 and the drift region 11 are p-doped.

The operating principle of the MOSFET according to FIG. 6 is now explained with reference to an n-MOSFET. However, this operating principle is also valid for a p-type MOS- FET, where in this case the doping types of the individual semiconductor regions are complementary to the doping types of an n-MOSFET, and the polarities of voltages have an opposite sign.

When the MOSFET is in operation a fixed drive potential or drive voltage can be applied to the control terminal G2. This drive voltage $V_{G2}$ is, for example, a voltage relative to the potential of the source terminal S. The operation state of the MOSFET is defined by the electrical potential at the gate terminal G, where this potential varies dependent on the desired operation state (on-state or off-state) of the MOSFET. In an n-type MOSFET the drive voltage $V_{G2}$ at the control terminal G2 is, for example, a negative voltage. When the MOSFET is in its on-state a conducting channel is generated by the gate electrode 15 along the gate dielectric 16 in the body region 12, so that charge carriers (electrons in a n-type MOSFET) can flow from the source region 13, via the conducting channel in the body region 12 and the drift region 11 to the drain region 17. In an enhancement MOSFET the conducting channel in the body region 12 is an inversion channel.

When the MOSFET is switched off and the conducting channel along the gate dielectric 16 is interrupted, a depletion region propagates in the drift region 11 starting at the pn-junction between the body region 12 and the drift region 11 and starting at the pn-junction between the compensation region 61 and the drift region 11. In the off-state the majority of the dopants (of the doping charge) in the drift region is "compensated" by complementary dopants in the compensation region 61. This mechanism allows to provide a higher doping concentration in the drift region 11, resulting in a lower on-resistance, as compared with conventional (non-superjunction) components without decreasing the voltage blocking capability. The presence of the compensation region, however, results in a increase of the output capacitance as compared with conventional components.

In the component of FIG. 6, the output capacitance can be reduced by suitably adjusting the drive potential $V_{G2}$. In an n-type (p-type) transistor the output capacitance decreases with an increasing absolute value of a negative (positive) drive potential. However, applying a drive potential $V_{G2}$ other than zero has the effect that there is permanently a depletion region between the compensation region 61 and the drift region 11, where the width of this depletion region increases with increasing absolute value of the drive potential $V_{G2}$. This depletion region, however, partly "pinches off" the drift region 11, which means that the width of a channel in the drift region 11 in which charge carriers can flow is reduced. This results in an increase of the on-resistance of the transistor.

Referring to the explanation provided with reference to FIGS. 3 to 6 and in particular with reference to FIG. 4, the electrical energy stored in the output capacitances of the transistors according to FIGS. 3 and 5 decreases, when the absolute value of drive potential $V_{G2}$ at the control terminals G2 is decreased. However, when the drive potential at the control terminal G2 is decreased, the performance of the second conducting channel, which is controlled by the drive potential $V_{G2}$, decreases. When the performance of the second conducting channel decreases, the ohmic losses during the on-state are increased.

In the component of FIG. 6, the electrical energy stored in the output capacitances decreases, when the absolute value of drive potential $V_{G2}$ at the control terminals G2 is increased. However, when the drive potential at the control terminal G2 is increased, the channel in the drift region 11 is partly pinched off, resulting in an increase of the ohmic losses in the on-state.

Figure 8:
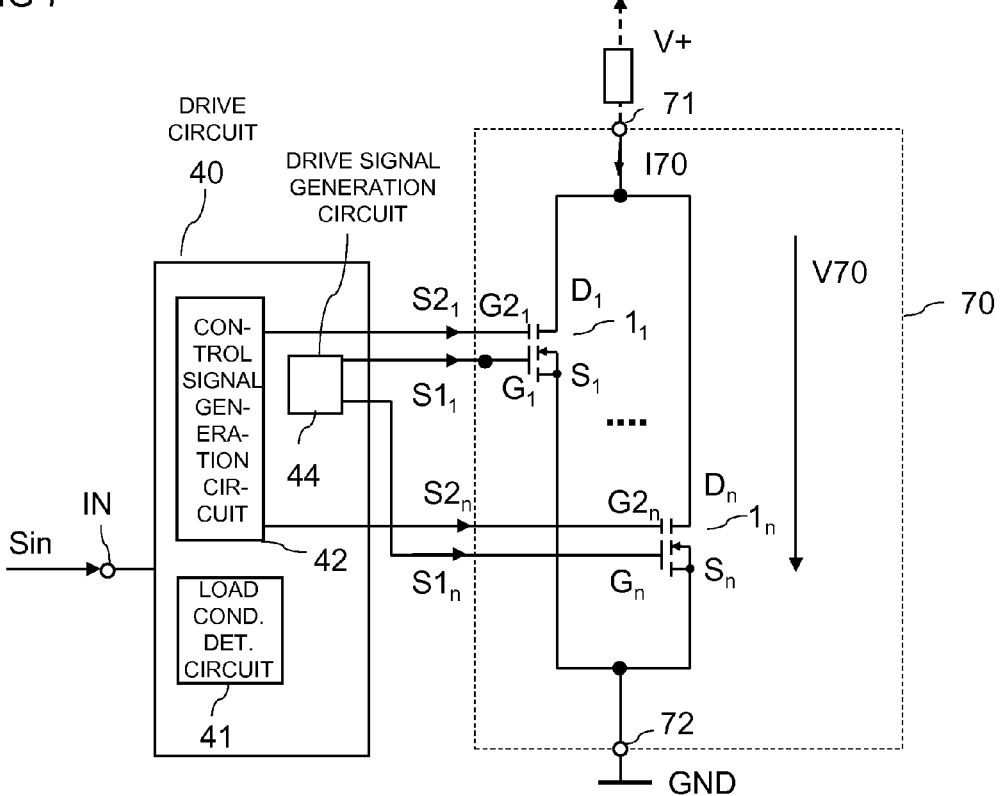
FIG. 8 illustrates a second embodiment of circuit arrangement that includes a transistor arrangement with a plurality of transistors and with a drive circuit.

The transistors according to FIGS. 3, 5 and 6 can be implemented with a plurality of identical structures, which are commonly known as transistors cells. In FIGS. 3, 5 and 6 only one transistor cell is illustrated. In a transistor with a plurality of transistor cells, these transistor cells are connected in parallel by having the source regions 13 of the individual cells connected to a common source electrode, by having the gate electrodes 15 of the individual cells connected to a common gate terminal, by having the drain and drift regions 17, 11 of the individual cells connected to a common drain terminal, and by having the drift control region 21 (see FIG. 3), the field electrode 51 (see FIG. 5), or the compensation region 61 (see FIG. 8) connected to a common control terminal G2.

Referring to what has been explained hereinbefore with reference to FIGS. 3, 5 and 6, there is a tradeoff between ohmic losses and capacitive losses, wherein this tradeoff is dependent on the load condition of the transistor. The load condition is, for example, defined by the load current flowing through the transistor in its on-state and/or by a switching frequency at which the transistor is operated. When, for example, the load current is high, it is desirable to reduce the on-resistance in order to decrease the ohmic losses, even if this results in a small increase of the total switching losses. Although the capacitive losses are independent of the current the switching losses in transition phases during turn-on and/or during turn-off increase at high load currents. The ohmic losses mainly govern the overall losses at high load currents because they increase with the square of the load current. At low load currents it is, however, desirable to decrease the capacitive losses by reducing the energy stored in the output capacitance at each switching cycle, because at low load currents the capacitive losses mainly govern the overall losses. When the switching frequency is low, it is desirable to reduce the ohmic losses, because at low switching frequencies the ohmic losses mainly govern the overall losses.

A circuit arrangement for switching an electrical load that in view of losses can be operated in an optimum operation point is explained next with reference to FIG. 7. This circuit arrangement includes a transistor arrangement 70 with a plurality n of transistors $1_1$, $1_n$, with n≥2. Each transistor has a load path between a drain terminal $D_1$, $D_n$ and a source terminal $S_1$, $S_n$, and a gate terminal $G_1$, $G_n$. At least n−1 of the transistors $1_1$, $1_n$ have a control terminal $G2_1$, $G2_n$, where in the embodiment illustrated in FIG. 7, each of the transistors $1_1$, $1_n$ has a control terminal $G2_1$, $G2_n$. The at least two transistors $1_1$, $1_n$ have their load paths connected in parallel with each other and have their load paths connected between load terminals 71, 72 of the transistor arrangement 70.

The transistor arrangement 70 is operable to act as an electronic switch for an electrical load Z (illustrated in dashed lines). For this, the transistor arrangement 70 can be connected in series with the load, where the series circuit with the load Z and the transistor arrangement can be connected between a terminal for a positive supply potential V+ and a terminal for a negative supply potential or reference potential, such as ground GND. In the embodiment illustrated in FIG. 7, the transistor arrangement 70 and the load Z are connected to form a low-side configuration, which means that the transistor arrangement 70 is connected between the load Z and the terminal for the negative supply potential GND. However, this is only an example. The transistor arrangement 70 and the load could also be connected to form a high-side configuration, in which the transistor arrangement 70 is connected between the load Z and the terminal for the positive supply potential V+.

The transistors $1_1$, $1_n$ of the transistor arrangement 70 can be implemented in accordance with one of the principles explained with reference to FIGS. 3, 5 and 6. However, any other type of transistor which, besides a gate terminal, includes a control terminal that is configured to adjust the voltage-dependency of an output capacitance can be used as well.

Figure 7:
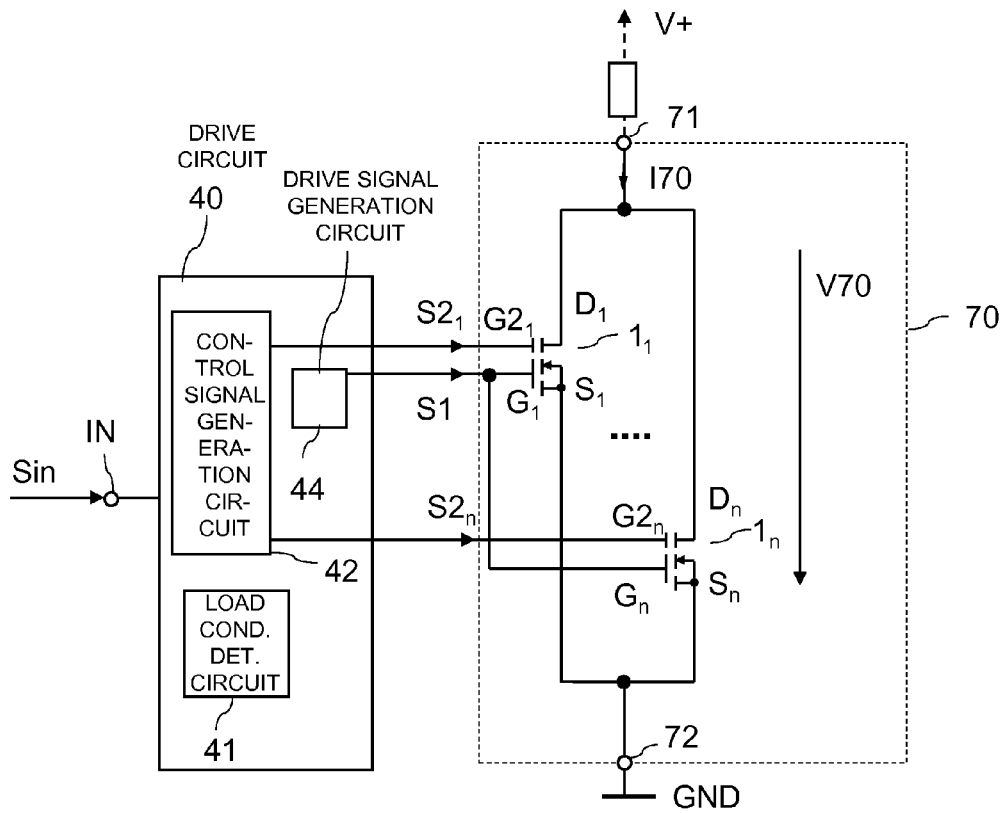
FIG. 7 illustrates a first embodiment of circuit arrangement that includes a transistor arrangement with a plurality of transistors and with a drive circuit.

Referring to FIG. 7, the circuit arrangement further includes a drive circuit 40 which is coupled to the gate terminals $G_1$, $G_2$ and the control terminals $G2_1$, $G2_2$ of the transistors $1_1$, $1_n$. In the embodiment illustrated in FIG. 7, the drive circuit 40 provides a common drive signal S1 received at the gate terminals $G_1$, $G_n$ of the transistors $1_1$, $1_n$, and provides individual control signals $S2_1$, $S2_n$, with each of these control signals $S2_1$, $S2_n$ being received at the control terminal of one of the transistors $1_1$, $1_n$. These control signals correspond to the drive potential $V_{G2}$ explained with reference to FIGS. 3, 5 and 6 and serve to adjust the voltage-dependency of the output capacitance of the corresponding transistor. In the circuit of FIG. 7 a first control signal $S2_1$ influences the voltage-dependency of the output capacitance of first transistor $1_1$, while a second control signal $S2_2$ influences the voltage-dependency of the output capacitance of second transistor $1_n$.

A transistor arrangement with n=2 transistors is only an example. Dependent on the specific application any number n of transistors can be connected in parallel. The number of control signals provided by the drive circuit 40 may correspond to the number of transistors, so that each of the transistors $1_1$, $1_n$ receives a control signal $G2_1$, $G2_n$. However, it is also possible to provide less control signals than transistors. In this case, only some of the transistors, namely those transistors that receive a control signal, can be switched between the first and second activation states.

The transistors $1_1$, $1_{in}$ can be switched on and off in a conventional manner by the drive signal S1. The transistors $1_1$, $1_n$ are switched on when the drive signal S1 assumes an on-level and wherein the transistors $1_1$, $1_n$ are switched off when the drive signal S1 assumes an off-level. When the transistors are n-type transistors, the on-level corresponds to a positive voltage relative to source potential, while the off-level corresponds to zero or a negative voltage relative to source potential. In p-type transistors, the on-level corresponds to a negative voltage and the off-level is zero or a positive voltage.

Further, in the embodiment illustrated in FIG. 7, each of the transistors $1_1$, $1_n$ has an activation state which can be adjusted by the corresponding control signal $S2_1$, $S2_n$. The drive circuit 40 is configured to independently adjust the activation state of each of the transistors $1_1$, $1_n$ to one of two different states, namely a first activation state and a second activation state. These activation states are selected such that the transistors $1_1$, $1_n$ in the first activation state have lower ohmic losses or a lower on-resistance than in the second activation state. Consequently, the capacitive losses are higher in the first activation state than in the second activation state. The number of transistors that can be switched between the first and second activation states using a control signal can be less than the overall number n of transistors. Thus m, with m≤n and m≥1, can be switched between the first and second activation states.

In the following, $1_i$ denotes one of the plurality of transistors $1_1$, $1_n$ when a distinction between the individual transistors is not required, and $S2_i$ denotes the corresponding control signal. The signal level of the control signal $S2_i$ that adjusts the first activation state of the corresponding transistor $1_i$ is referred to as first control signal level in the following, and the signal level of the control signals $S2_i$ that adjusts the second activation state of the transistor $1_i$ is referred to as second control signal level in the following. The absolute value of the first and second control signal levels is dependent on the specific type of the transistor $1_i$. In this connection it should be mentioned that the transistors $1_1$, $1_n$ can be transistors of the same type or can be transistors of different types.

The first and second control signal levels are selected from a control signal range that is suitable to influence the activation state of the transistor $1_i$. This signal range and the first and second control signal levels are dependent on the specific type of transistor. Assume, for example, that the transistor $1_i$ is an n-type transistor with a drift control region 21 as illustrated in FIG. 3. In this case, the control signal range includes positive signal levels, like, e.g., signal levels in the range of between 0V and 20V. The first control signal level, that adjusts a low on-resistance, has a higher signal level than the second control signal level, that adjusts a higher on-resistance. According to one embodiment, the second control signal level is zero.

In an n-type transistor with a field plate 51 as illustrated in FIG. 5, the control signal range may range from a negative signal level to a positive signal level, like, e.g. from −10V to 10V, where the absolute value is dependent on the voltage blocking capability of the component and is dependent on the thickness of the field electrode dielectric 52. In this case, the first control signal level is more positive than the second control signal level. According to one embodiment, the first control signal level is a positive level while the second control signal level is zero or a negative level. Referring to FIG. 5, a negative signal level of the control signal $V_{G2}$ causes a depletion region in the drift region 11 around the field plate 51 even when the transistor is in its on-state. This depletion region results in an increased on-resistance.

In a transistor with a compensation zone 61 as illustrated in FIG. 6, the control signal range may range from a negative signal level, like −10V, to zero. In this type of transistor, the first control signal level is more positive than the second control signal level. According to one embodiment, the first control signal level is zero, while the second control signal level is a negative level.

The explanations concerning the control signal range and the first and second control signal levels applies to p-type transistors accordingly, wherein in p-type transistors the signal levels defining the signal range have a reverse sign as compared with an n-type transistor, and the first signal level is more negative than the second control signal level.

The transistor arrangement 70 has an output capacitance $C_{OSS,70}$ that corresponds to the sum of the output capacitances $C_{OSS,1}$, $C_{OSS,n}$, of the individual transistors $1_1$, $1_n$ connected in parallel. In general:

$$C_{OSS,70} = \sum_{i=1}^{n} C_{OSS,i} \quad (2)$$

where $C_{OSS,i}$, denotes the output capacitance of the transistors $1_i$ connected in parallel. Consequently, the output energy $E_{OSS,70}$ stored in the output capacitance of the transistor arrangement is:

$$E_{OSS,70} = \sum_{i=1}^{n} E_{OSS,i} \quad (3)$$

where $E_{OSS,i}$ denotes the output energy stored in one transistors $1_i$ connected in parallel, where this energy is dependent on a voltage V70 across the load path of the transistor arrangement 70.

Further, the transistor arrangement 70 has an on-resistance $R_{ON,70}$ that is dependent on the on-resistances $R_{ON,i}$ of the individual transistors $\mathbf{1}_i$ as follows:

$$R_{ON,70} = \frac{1}{\sum_{i=1}^{n} \frac{1}{R_{ON,i}}}. \quad (4)$$

Equations (2)-(4) are not restricted to n=2 transistors connected in parallel, but are valid for any plurality n of transistors, where n≥2.

There is a tradeoff between ohmic losses and capacitive losses in each of the transistors $\mathbf{1}_i$ connected in parallel. The ohmic losses and the capacitive losses of the transistor arrangement 70 can be adjusted by varying a number k of transistors that are in the first activation state and varying a number m−k of transistors that are in the second activation state, where k≤m. Here, m is the number of transistors that can be switched between the first and second activation state, with m≤n, which has already been explained herein above.

For explanation purposes it is assumed that the individual transistors $\mathbf{1}_i$ connected in parallel are identical and that these transistors have a first on-resistance $R_{ON1}$ when the transistors $\mathbf{1}_i$ are in the first activation state and have a second on resistance $R_{ON2}$ when the transistors are in the second activation state, where the second on-resistance $R_{ON2}$ is much higher than the first on-resistance $R_{ON1}$. Further it is assumed that m=n transistors can be switched between the first and second activation states. When, for example, all the transistors $\mathbf{1}_i$ are in the first activation state, the on-resistance $R_{ON,70}$ of the transistor arrangement, referring to equation (4) is:

$$R_{ON,70} = \frac{R_{ON1}}{n}. \quad (5)$$

When, for example, only one of the n transistors is in the first activation state, while the other n−1 transistors are in the second activation state, then the on-resistance $R_{ON,70}$ of the transistor arrangement, referring to equation (4), is:

$$R_{ON,70} = \frac{R_{ON1}}{\frac{(n-1)R_{ON1}}{R_{ON2}} + 1} \quad (6a)$$

where $$R_{ON,70} \approx R_{ON1} \quad (6b)$$

when the second resistance is significantly higher than the first resistance, such as 10 times higher than the first resistance.

It can be seen from equations (5), (6a) and (6b) that by varying the number of transistors that are in the first activation state the overall on-resistance $R_{ON,70}$ of the transistor arrangement 70 can be varied. If the individual transistors $\mathbf{1}_i$ are identical and have a first on-resistance $R_{ON1}$ in the first activation state and a second on-resistance $R_{ON2}$ in the second activation state, where $R_{ON2} \gg R_{ON1}$, then the on-resistance $R_{ON,70}$ of the transistor arrangement 70 can be varied in discrete steps of $R_{ON1}/n$ between $R_{ON1}/n$ and $R_{ON1}$ by varying the number of k transistors that are in the first activation state.

Implementing the individual transistors $\mathbf{1}_i$ to be identical is only an example. The individual transistors may be implemented such that they have mutually different on-resistances in the first activation state and that they have mutually different on-resistances in the second activation state. The on-resistance of the transistor arrangement 70 can nevertheless be varied by varying the number k of transistors that are in the first activation state.

When the number k of transistors in the first activation state is increased in order to reduce the on-resistance $R_{ON,70}$ and, therefore, in order to reduce the ohmic losses, the capacitive losses are increased. Since the ohmic losses and the capacitive losses are dependent on the load condition, there is an optimum number k of transistors in the first activation state for each load condition. According to one embodiment, the drive circuit 40 is configured to detect or determine a load condition of the transistor arrangement 70 and to select the number k of transistors that are driven in the first activation and the number m−k, with m≤n, of transistors that are driven in the second activation state dependent on the load condition.

When the individual transistors have different on-resistances, then not only the number k of transistors that are in the first activation state influences the overall on-resistance and capacitive losses, but also the choice of which of the transistors is in the first activation state influences the on-resistance and capacitive losses.

The on-resistance of each of the individual transistors in the first activation state can be adjusted by suitably selecting the active area or size of the individual transistor. It is commonly known that the on-resistance of a transistor decreases when the active area increases.

The transistor arrangement 70 may include a cell array with plurality of identical transistor cells. This cell array may be subdivided into n groups of transistor cells, where each of these groups includes at least one transistor cell. The transistor cells of each group may be connected in parallel, so that the transistor cells of each group form one of the n transistors of the transistor arrangement 70. The size of each of these transistors is dependent on the number of transistor cells the transistor includes, and the on-resistance of each of these transistors is approximately proportional to the number of transistor cells it includes. Thus, the on-resistance of the individual transistors can be adjusted by suitably selecting the number of transistor cells that are included in each of the transistors.

According to one embodiment, the transistor arrangement 70 includes n transistors which have different sizes. According to one embodiment the size of each transistor is $a \cdot p^i$, where i is selected from an interval including integral numbers from 0 to n−1, i.e. i∈[0,n−1]. The size of a smallest one of the n transistors is a ($= a \cdot p^0$), which will be referred to as "basic size" in the following. The size of each of the n transistors is a multiple of this basic size, wherein a largest one of the transistors has size $a \cdot p^{n-1}$. p can be an arbitrary number with p>0. According to one embodiment, p=2.

For explanation purposes it will be assumed that the on-resistance of each of the n transistors in the second activation state is much higher than the on-resistance of the smallest transistor (the transistor with size a) in the first activation state, so that each transistor that is in the second state can be considered to be deactivated. In this case, the active area or size of the transistor arrangement 70 corresponds to the sum of the sizes of the transistors that are in the first activation state. Thus, by suitably selecting the transistors that are in the first activation state, the active area of the transistor arrangement 70 can be varied between a ($= a \cdot p^0$) and $$a \sum_{i=0}^{n-1} p^i.$$

If, for example, p=2, then the active area of the transistor arrangement 70 can be varied between a and $a \cdot (2^n-1)$ in steps of (with a granularity) of a. The on-resistance of the transistor arrangement 70 is inversely proportional to the transistor size. Let $R_0$ be the on-resistance of the smallest transistor (which is the transistor with size a), then the on-resistance of the transistor arrangement can be varied between $R_0$, when only the smallest transistor is in the first activation state, and $R_0/(2^n-1)$, when all the transistors are in the first activation state, by suitably selecting the transistors that are in the first activation state.

The first and second activation states can be, in particular, selected such that the on-resistances of each transistors $1_i$ has a minimum value when the transistor is in the first activation state (and is switched on), where the on-resistance in the second activation state is significantly higher, such as at least 10, 100 ($=10^2$), or even 1000 ($=10^3$) times higher. Thus, transistors that are in the first activation state are referred to as activated transistors in the following, while transistors that are in the second activation state are referred to as deactivated transistors in the following. The overall active area (size) of the transistors of the transistor arrangement 70 that are in the first activation state (activated) is referred to as activated area in the following.

Referring to FIG. 7, the drive circuit 40 includes a load condition detection circuit 41 configured to detect or to determine a load condition of the transistor arrangement 70. The drive circuit 40 is configured to generate the activations signals $S2_i$ dependent on the detected load condition so as to select the transistors $1_i$ that are driven in the first activation state dependent on the load condition. A control signal generation circuit 42 generates the control signals $S2_i$ dependent on the load condition detected by the load condition detection circuit 41. If the individual transistors of the transistor arrangement 70 have the same size, the overall on-resistance is only dependent on the number k of transistors that are in the first activation state. In this case, the control signal generation circuit 42 calculates k dependent on the load condition and generates k control signals $S2_i$ such that they drive the corresponding transistor $1_i$ into the first activation state. If, however, the sizes of the individual transistors $1_i$ are mutually different, the control signal generation circuit 42 selects the individual transistors that are driven in the first activation state dependent on the load condition. For this, the control signal generation circuit 42 may include a look-up table that provides information on which of the transistors $1_i$ are to be driven in the first activation state dependent on the detected load condition.

A drive signal generation circuit 44 generates the drive signal S1 dependent on an input signal received by the drive circuit 40. This input signal Sin can assume two different signal levels, namely an on-level and an off-level. The drive circuit 40 is configured to switch the n transistors $1_1, 1_n$ on when the input signal Sin has an on-level and off when the input signal Sin has an off-level. Optionally, a gate resistor (not shown) is connected between the drive signal generation circuit 40, and the gate terminals $G_1, G_n$ of the individual transistors $1_1, 1_n$.

The transistors that are in the second activation state have a relatively high second on-resistance $R_{ON2}$ as compared with the first on-resistance $R_{ON1}$ of the transistors in the first activation state. Thus, the transistors $1_i$ in the second activation state only conduct a relatively small share of an overall current I70 through the transistor arrangement 70, while a major part of this current flows through the transistors in the first activation state. Besides capacitive losses that result from charging and discharging the output capacitances of the individual transistors $1_i$ there are further capacitive losses which result from charging and discharging the gate electrodes of the transistors when the transistors are switched on and off, respectively. According to a further embodiment illustrated in FIG. 8, the drive circuit 40 is configured to provide n gate drive signals $S1_1, S1_2$, one for each transistor $1_i$, and is configured to switch these transistors $1_i$ on and off independent of each other. According to one embodiment, the drive circuit is configured to drive those transistors that are in the second activation state in the off state so as to reduce the further capacitive losses. The k transistors that are in the first activation state can be switched on and off in a conventional manner. According to one embodiment, these transistors are switched on and off dependent on the input signal Sin received by the drive circuit 40. This input signal can assume two different signal levels, namely an on-level and an off-level. The drive circuit 40 is configured to switch the k transistors that are in the first activation state on when the input signal Sin has an on-level and off when the input signal Sin has an off-level.

According to one embodiment, the control signals $S2_1, S2_n$ are voltages between the gate terminals $G_i$ and the source terminals $S_i$ of the individual transistors $1_i$. Referring to the embodiment illustrated in FIG. 9, the control signals $S2_i$ can be voltages across capacitors $43_1, 43_n$— which will also be referred to as control capacitors in the following—connected between the control terminal $G2_i$ and the source terminal $S_i$ of each transistor $1_i$. In the following, $43_i$ denotes one of these capacitors $41_1, 43_n$. Each of the capacitors $43_i$ of the individual transistors $1_i$ can be identical with the capacitor 43 of FIG. 3 which, in the off-state of a transistor according to FIG. 3, can buffer electrical charge, from the drift control region 21.

Figure 9:
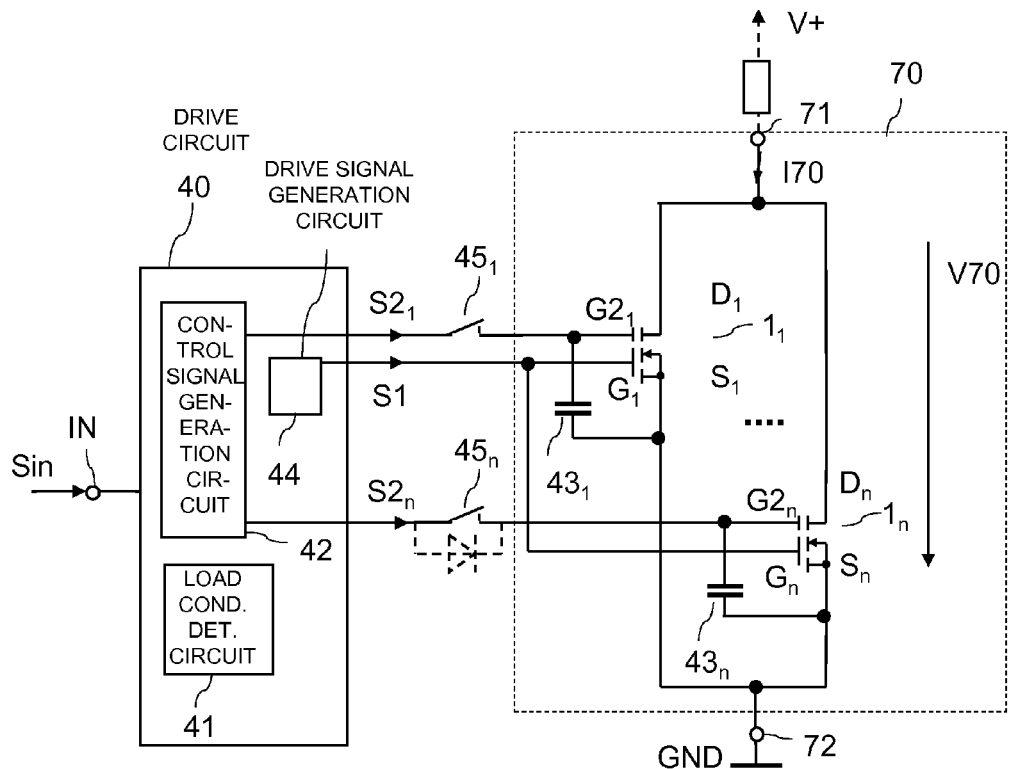
FIG. 9 illustrates a third embodiment of circuit arrangement that includes a transistor arrangement with a plurality of transistors and with a drive circuit.

Optionally a switching element $45_i$ ($45_i$ denotes one of switching elements $45_1, 45_n$ shown in FIG. 9) is connected between the control signal generation circuit 41 and the control terminals $G2_i$ of the individual transistors as shown in FIG. 9. According to one embodiment the switching elements $45_i$ are driven such that they connect the control terminals $G2_i$ of each transistor $1_i$ to the control signal generation circuit 42 only during either the on-state or the off-state of the transistor $1_i$, or even only during a part of the on-state or a part of the off-state. The switching elements $45_i$ can, for example, be driven dependent on the drive signal S2 or $S2_i$, respectively. In case there are potential swings at the control terminals $G2_i$ during one switching cycle, disconnecting the control signal generation circuit 42 from the control terminals $G2_i$ during the on-states or the off-states of the transistors $1_i$ prevents instabilities in generating the control signals $S2_i$. Voltage swings at the control terminals $G2_i$ may occur when using specific types of transistors, such as transistors of the transistor type illustrated in FIG. 3. The control signal generation circuit 42 has a high output impedance at the individual outputs when the switching elements $45_i$ are in their off-state, i.e. when the switching elements $45_i$ interrupt the connection between the control signal generation unit 42 and the transistors $1_i$.

Instead of the switching elements $45_i$ rectifier elements, like diodes, can be connected between the control signal generation circuit 41 and the capacitors $43_i$. One such diode is illustrated in dashed lines in FIG. 9. When diodes instead of switches are used, the capacitors $43_i$ are only charged when the corresponding transistor $1_i$ is in its on-state, i.e. when the voltage swing of the voltage across the capacitor $43_i$ has a minimum. The voltages across the capacitors $43_i$, which correspond to the control signals $S2_i$, are adjusted by the control signal generation circuit 41.

The control signal generation circuit 41 is configured to generate two different signal levels of the control signals $S2_i$, namely a first signal level to drive the corresponding transistor $1_i$ in the first activation state, and a second signal level to drive the corresponding transistor $1_i$ in the second activation state, dependent on a load condition of the transistor arrangement. The load condition detected by the load condition detection circuit 41 can be dependent on different parameters.

Figure 10:
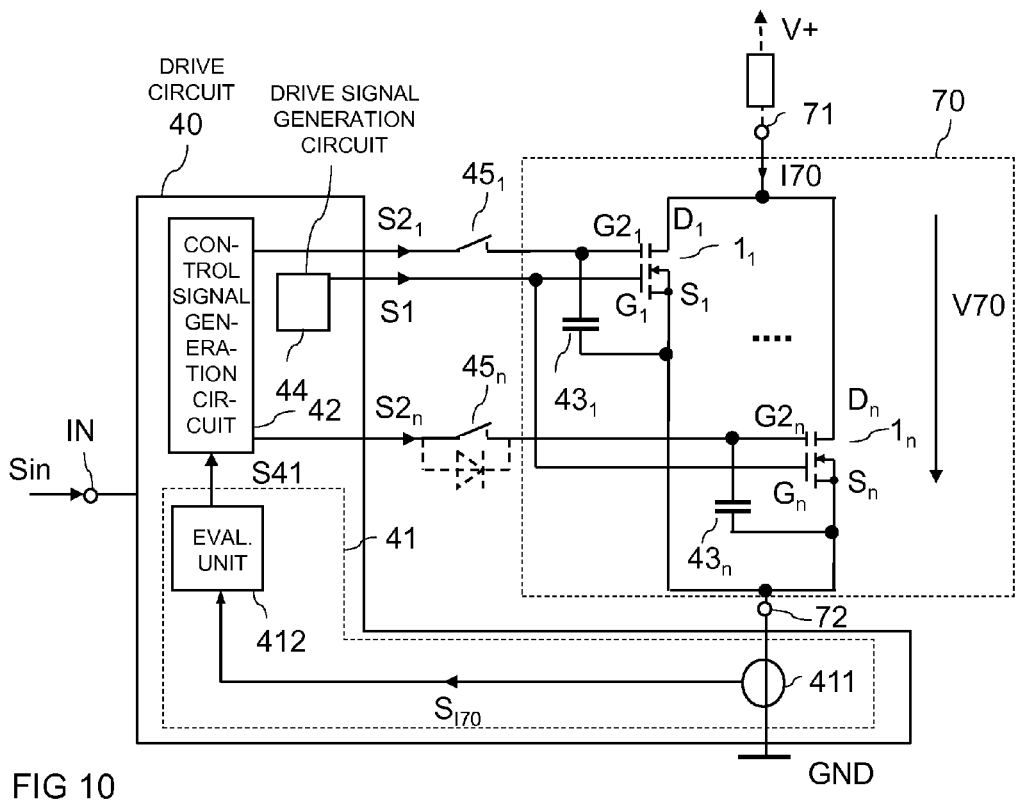
FIG. 10 illustrates an embodiment of the drive circuit in detail.

According to an embodiment illustrated in FIG. 10, the load condition is dependent on a load current I70 flowing through the transistor arrangement 70. In order to detect the load condition, the load condition detection circuit 41 in this embodiment includes a current measurement unit 411 which is configured to measure or detect the load current I70 flowing through the transistor arrangement 70, and to provide a current measurement signal $S_{I70}$ which is dependent on the load current I70. According to one embodiment the current measurement signal $S_{I70}$ is proportional to the load current I70. The current measurement unit 411 can be implemented like a conventional current measurement unit, such as a shunt, that is configured to measure a load current through a transistor arrangement, such as the transistor arrangement 70 of FIG. 10. In FIG. 10 the current measurement unit 411 is arranged between the transistor arrangement 70 and the terminal for the reference potential GND. However, this is only an example. The current measurement unit 411 can be arranged anywhere where it may seem appropriate to detect the load current I70 flowing through transistor arrangement 70. Such current measurement units are commonly known, so that no further explanation is required in this regard.

The circuit arrangement shown in FIG. 10 is based on the arrangement of FIG. 9. However, this is only an example. The current measurement unit 411 can be used in connection with each of the circuit arrangements illustrated in FIGS. 7 to 9.

Instead of directly measuring the current through the transistor arrangement 70 using the current measurement unit 411 coupled to the load path of the transistor arrangement 70, other means can be used which calculate or predict the load current I70 of the transistor arrangement 70. According to one embodiment, the load current I70 is (approximately) determined by measuring the voltage drop V70 across the transistor arrangement 70 in its on-state. The "on-state" of the transistor arrangement 70 is an operating state in which at least one of the transistors $1_i$ is in its on-state. In this case, also at least the number of transistors that are in the first activation state needs to be taken into account when calculating the load current based on the voltage drop V70.

According to a further embodiment, the voltage drop V70 across the transistor arrangement 70 is measured and the activated active area is selected such that this voltage drop is within a given voltage range. If, for example, the voltage drop is below this range, the activated area is decreased by, for example, deactivating at least one transistor or by deactivating a larger transistor and activating a smaller one. If, for example, the voltage drop is above the signal range, at least one additional transistor is activated or a smaller transistor is deactivated and a larger transistor is activated. In this case, the number k of activated transistors and/or the choice, which of the transistors are activated, provides a measure on the load current.

Alternatively or additionally, the temperature of the transistor 1 can be measured. The temperature is a measure for the electric power which is dissipated in the transistor arrangement 70, wherein the electric power is dependent on the load current I70. Thus, the temperature (indirectly) is a measure for the load current I70.

Referring to FIG. 10, the load condition detection circuit 41 further includes an evaluation unit 412 which receives the current measurement signal $S_{I70}$ and which is configured to detect the load condition of the transistor arrangement 70 dependent on the current measurement signal $S_{I70}$. The control signal generation unit 42 selects the transistors $1_i$ that are driven in the first activation state dependent on the load condition detected by the evaluation unit 412. The evaluation unit 412 may generate a load signal S41 which represents the load condition and which is received by the control signal generation unit 42.

Figure 11:
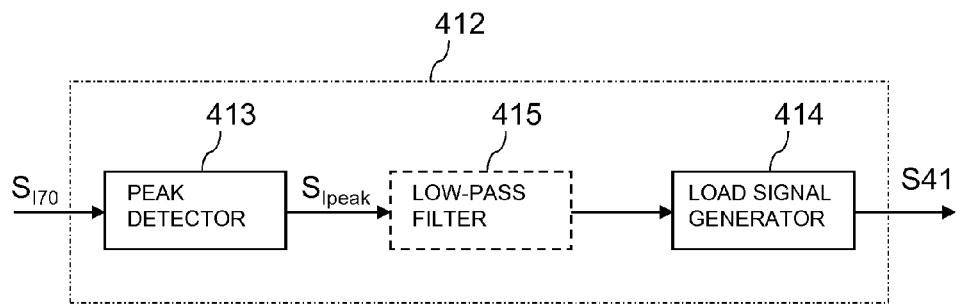
FIG. 11 illustrates a first embodiment of a load detection circuit implemented in the driver circuit.

According to one embodiment the evaluation unit 412 is configured to detect the maximum of the load current I70 by evaluating the current measurement signal $S_{I70}$ and to generate the load signal S41 based on the detected maximum value. A block diagram of an embodiment of the evaluation unit 412 having such functionality is illustrated in FIG. 11. This evaluation unit 412 includes a peak detector 413 which receives the current measurement signal $S_{I70}$ and which provides a peak detection signal $S_{Ipeak}$. A load signal generation unit 414 receives the peak signal $S_{Ipeak}$ and maps the peak signal $S_{Ipeak}$ to a corresponding signal value of the load signal S41 provided at the output of the load signal generation unit 414.

According to one embodiment, the control signal generation unit 42 is configured to increase the number k of transistors $1_i$ that are driven in the first activation state with increasing load current I70 represented by the load signal S41.

Figure 12A:
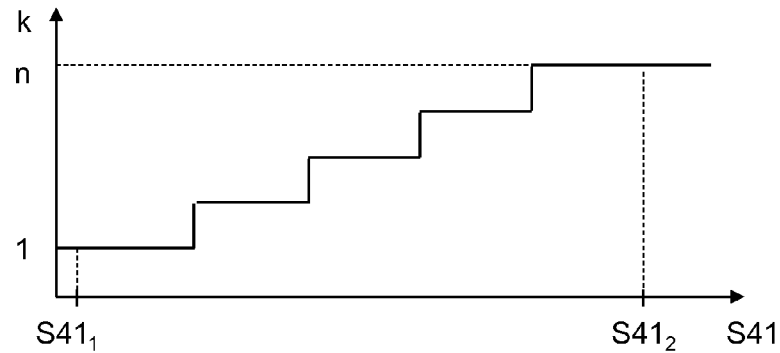
FIGS. 12A and 12B illustrates the operating principle of the drive circuit according to a first embodiment.

FIG. 12A schematically illustrates k dependent on (over) the load signal S41. As can be seen, k increases when the load signal S41 increases. In the embodiment illustrated in FIG. 12A, k increases for load signal S41 values that are within a signal range defined by $S41_1$ and $S41_2$. For load signal values S41 below $S41_1$ and for load signal values S41 higher than $S41_2$ k is constant, with k=1 for $S41<S41_1$, and k=n for $S41>S41_1$. In the embodiment illustrated in FIG. 12A, n=5. However, this is only an example. Any number of n other than 5 can be used as well. In this context there can also be load scenarios in which none of the transistors is activated, so that k=0.

In the embodiment illustrated in FIG. 12A, k increases "linearly" when the load signal S41 increases. This means that k is constant for intervals of the load signal S41 that have a same width. However, this is only an example. According to a further embodiment, k increases exponentially when the load signal S41 increases, or increases with the square of the load signal S41, or piece-wise linear, when the load signal S41 increases.

In order to prevent a short increase of the load current I70 from negatively influencing the selection of k, an optional low-pass filter 415 (see FIG. 11) can be connected between the peak detector 413 and the load signal generation unit 414. In this embodiment a low-pass filtered version of the peak current signal $S_{Ipeak}$ is received at the control signal generation unit 42.

Figure 13:
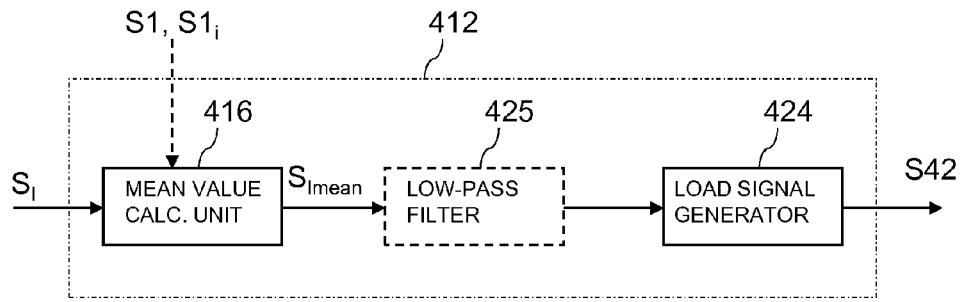
FIG. 13 illustrates a second embodiment of a load detection circuit implemented in the driver circuit.

Referring to FIG. 11, the load signal S41 can be generated to represent a peak value of the load current $S_{I70}$. According to a further embodiment illustrated in FIG. 13, the load signal S41 represents a mean value or rms value of the load current I70 within a given time frame. In this embodiment, the evaluation unit 412 is configured to evaluate a mean value or rms value of the load current $S_{I70}$ within a given time frame and is configured to generate the load signal S41 dependent on this mean value or rms value. The evaluation unit 412 includes a mean value or rms value calculation unit 416 which receives the current measurement signal $S_{I70}$, and which is configured to provide a mean value signal $S_{Imean}$ which is representative of the mean value or rms value of the load current $I70$ within a given time frame. The load signal generation unit 414 receives the mean value signal $S_{Imean}$ and generates the load signal S41 dependent on the mean value signal $S_{Imean}$. The generation of the load signal S41 dependent on the mean value signal $S_{Imean}$ can correspond to the generation of the control signal S41 dependent on the peak signal $S_{Ipeak}$ explained hereinbefore.

The mean value calculation unit 416 can be configured to determine the mean value or rms value during on-times and off-times of the transistor arrangement 70, where on-times are those time periods in which at least one of the transistors $1_i$ is switched on, and off-times are those times in which the transistors $1_i$ are switched off. According to a further embodiment the mean value calculation unit 416 is configured to calculate the mean value or rms value only during those times when the transistor arrangement 70 is in its on-state. For this, the mean value calculation unit 416 may receive the drive signal S1 or one of the drive signals $S1_i$ that drive(s) the transistors $1_i$ in the on-state and off-state. From the drive signal(s) S1 or $S1_i$ the mean value calculation unit 416 may determine those time periods in which the transistors $1_i$ are in their on-states, so as to measure the load current only during those time periods. According to a further embodiment (not illustrated) the load signal S41 generated by the load condition detection circuit 41 is configured to generate the load signal S41 dependent on a switching frequency of the transistor arrangement 70. The "switching frequency" is the frequency at which the transistors $1_i$ of the transistor arrangement 70 are switched on and off. The switching frequency is, for example, defined by the input signal Sin received by the drive circuit 40. The input signal Sin can be a pulsewidth-modulated (PWM) signal that governs switching on and switching off of the transistors $1_i$. The switching frequency of the transistor arrangement 70 can be determined in different ways. According to one embodiment, the frequency of the input signal Sin is evaluated. According to a further embodiment, the switching frequency can be determined from the current measurement signal $S_{I70}$ by calculating the time difference between two subsequent time periods at which the load current I70 is zero, where time periods at which the load current is zero are off-periods of the transistor arrangement 70. The switching frequency can also be determined by evaluating the drive signal S1 (see FIGS. 7, 9 and 10) or by evaluating the drive signals $S2_i$ (see FIG. 8) of the at least one transistor $1_i$ that is in the first activation state.

In the embodiment illustrated in FIG. 12A, only the number k of transistors that are activated is dependent on the load signal. In this case, the individual transistors may have identical active area.

Figure 12B:
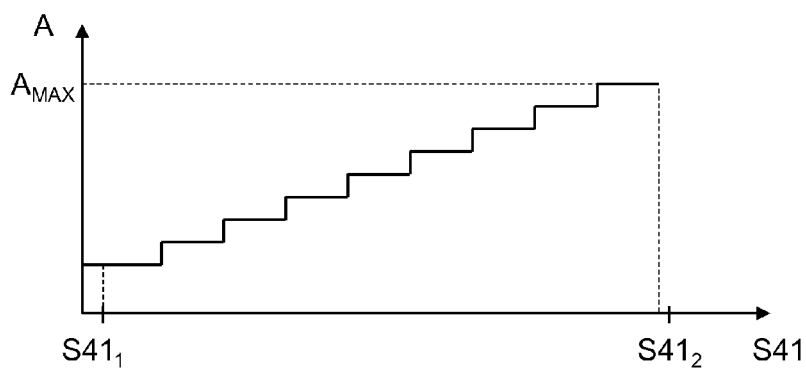

According to a further embodiment illustrated in FIG. 12B, the overall size A of activated transistors is varied dependent on the load state or load signal S41, respectively. The overall size of activated transistors is the sum of the active areas of the transistors that are activated, the overall size could, therefore also be referred to as activated active area. As can be seen from FIG. 12B, this activated active area increases with increasing load signal. In FIG. 12B, this increase is linear. However, this is only example. The activated active area could also increase exponentially, with the square of the load signal S41, or piece-wise linear, when the load signal S41 increases.

The increase of activated active area can be controlled by the number of activated transistors and/or a suitable choice of the activated transistors, wherein in the latter case, the individual transistors may have different sizes of their active areas.

Figure 14:
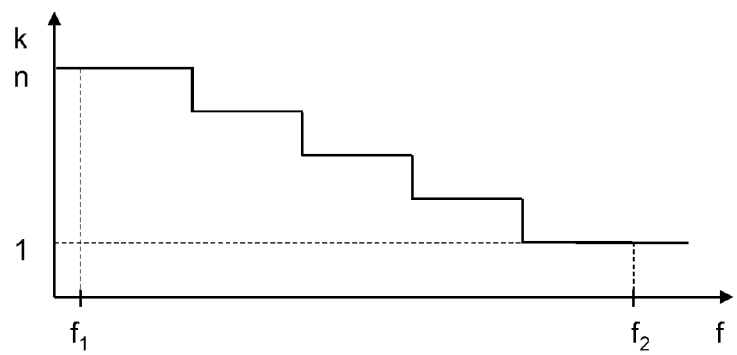
FIG. 14 illustrates the operating principle of the drive circuit according to a second embodiment.

According to one embodiment illustrated in FIG. 14, the control signal generation unit 42 is configured to decrease the number k of transistors $1_i$ that are driven in the first activation state with increasing switching frequency as represented by the load signal S41, in order to reduce the capacitive losses. FIG. 14 schematically illustrates k dependent on (over) the switching frequency f. As can be seen, k decreases when the switching frequency increases. In the embodiment illustrated in FIG. 14, k decreases for frequencies that are within a signal range defined by $f_1$ and $f_2$. For frequencies below $f_1$ and for frequencies higher than $f_2$ k is constant, with k=1 for f<$f_1$, and k=n for f>$f_2$.

Instead of (only) varying the number k of transistors that are activated dependent on the frequency, it is also possible to vary the activated active area dependent on the switching frequency. The variation of the activated active area dependent on the switching frequency is, in particular, such that the activated active area decreases with increasing switching frequency.

According to a further embodiment, both, the load current I70 and the switching frequency f are taken into account when generating the load signal S41. According to one embodiment a first load signal S41$_i$ dependent on the load current I70 is calculated, and a second load signal S41$_f$ dependent on the switching frequency is calculated, and these two load signals S42$_i$, S42$_f$ are combined, e.g., by calculating a weighted sum of these two signals S42$_i$, S42$_f$. According to one embodiment, the first load signal S42$_i$, that is dependent on the load current, has a higher weight.

The at least two transistors $1_1$, $1_n$ of the transistor arrangement 70 can be implemented in a common semiconductor body. This is explained next with reference to FIG. 15.

Figure 15:
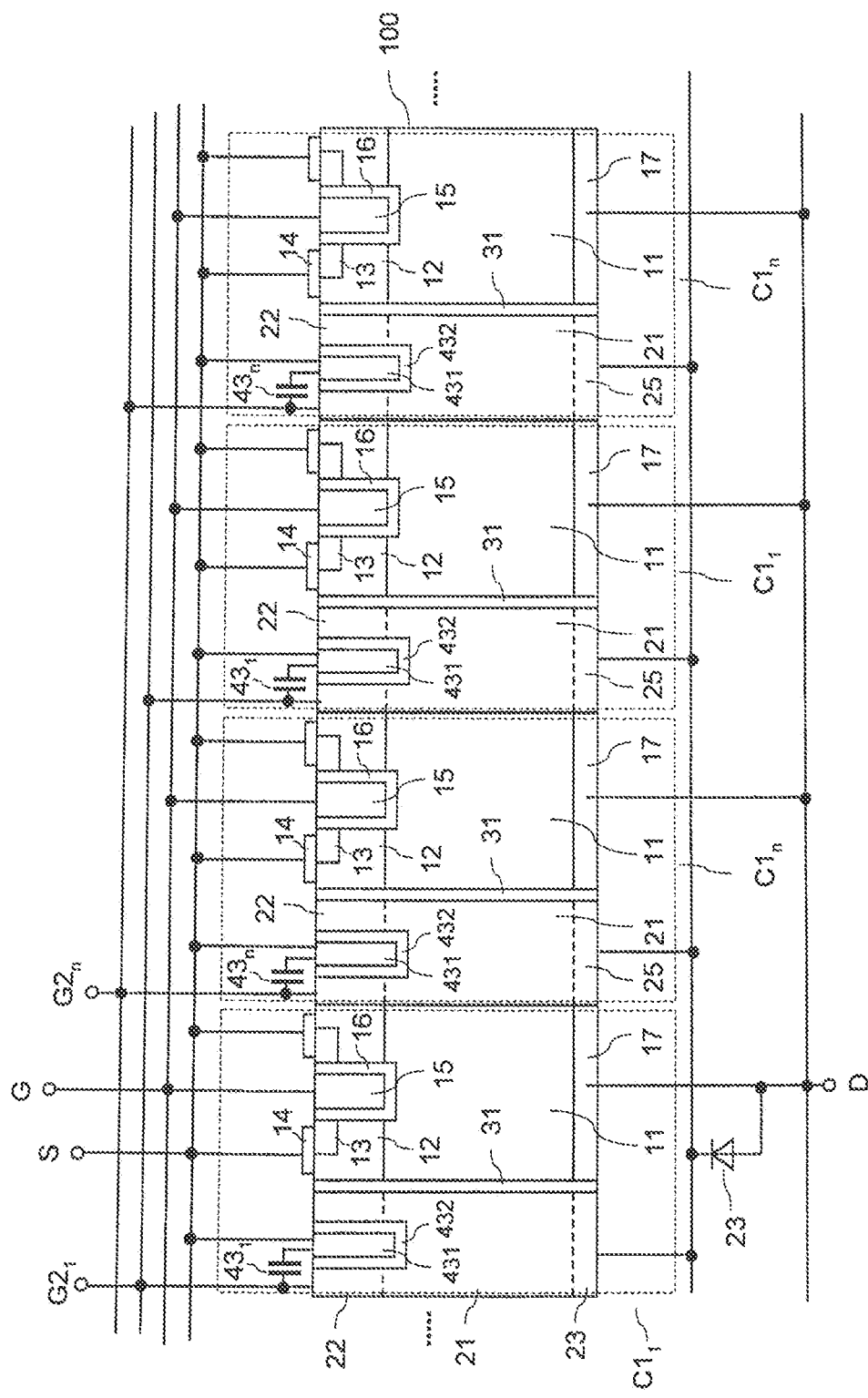
FIG. 15 illustrates a cross sectional view of a semiconductor body in which transistor cells of two transistors are implemented.

FIG. 15 illustrates a cross-sectional view of a semiconductor body 100 in which two transistors of a transistor type as illustrated in FIG. 3 are implemented. Each of these transistors includes a plurality of transistor cells that are arranged alternatingly in the semiconductor body 100. In FIG. 15, $C1_1$ denotes a transistor cell of the first transistor $1_1$, and $C1_n$ denotes a transistor cell of a second transistor $1_n$. In this embodiment, each transistor cell includes a drift control region 21 and drift control region dielectric 31 which separates the drift control region 21 from neighbouring drift regions 11 in a horizontal direction. Each transistor cell further includes two drift region 11 sections, namely those sections of the drift regions 11 which are adjacent to the drift control region dielectric 31.

The two transistors implemented in the semiconductor body 100 have their load paths connected in parallel. For this, the source regions 13 of the individual transistor cells are connected to a common source terminal S, and the drain regions 17 are connected to a common drain terminal D. Further, the two transistors have a common gate terminal G that is electrically connected with the gate electrodes 15 of the individual transistor cells. The drift control regions 21 of the transistor cells $C1_1$ of the first transistor are connected to a first control terminal $G2_1$, and the transistor cells $C1_n$ of the second transistor are connected to a second control terminal $G2_n$. Optional capacitors $43_1$, $43_n$ that are connected between the source terminal S and the first and second control terminals $G2_1$, $G2_n$ are integrated capacitors in the embodiment according to FIG. 15. Each of these capacitors includes a first capacitor electrode 431 connected to the source terminal S, a capacitive dielectric 432 and a second capacitive electrode, where in the embodiment of FIG. 15, the second capacitive electrode is formed by the drift control region 21 or the optional semiconductor region 22 doped complementarily to the drift control region 21. This second capacitive electrode of each transistor cell is connected to the corresponding control terminal $G2_1$, $G2_n$.

In FIG. 15, only two transistor cells $C1_1$ of a first transistor $1_1$ and two transistor cells $C1_n$ of a second transistor $1_n$ are shown. Each of these transistors may include a plurality of cells. The overall number of cells is, amongst others, dependent on the cell geometry, wherein several thousand up to several million cells can be arranged in the semiconductor body. The individual transistor cells may have a conventional transistor cell geometry, such as a stripe geometry, a rectangular geometry, a hexagonal geometry, etc. Further, the transistor cells of more than two transistors can be implemented in the semiconductor body 100. The individual transistors $1_1$, $1_n$ may have different sizes. The size of the transistors $1_1$, $1_n$ can be adjusted by the number of transistor cells that may vary dependent on the desired transistor size.

In the embodiment illustrated in FIG. 15, the transistor cells of the individual transistors are arranged alternatingly. However, this is only an example. It is also possible to subdivide the semiconductor body into a number of areas corresponding to the number of transistors $1_1$, $1_n$ of the transistor arrangement 70 and to implement the transistor cell of one of these transistors in each of these areas.

Integrating the at least two transistors $1_1$, $1_n$ in a common semiconductor body is only an example. According to a further embodiment (not shown), some or each of the transistors are integrated in one individual semiconductor body. These semiconductor bodies can be arranged in a conventional manner in a chip-on-chip-arrangement in which the individual semiconductor bodies are arranged one above the other, or in a chip-by-chip-arrangement in which the individual semiconductor bodies are arranged next to each other. In other embodiments at least some of these semiconductor bodies can be arranged in separate housings.

Referring to FIGS. 7 to 10, the circuit arrangement with the transistor arrangement 70 and with the drive circuit 40 has three terminals, namely two load terminals 71, 72 and an input or control terminal IN. This arrangement can be operated like a conventional transistor that acts as an electronic switch for switching an electric load. In a conventional transistor, however, capacitive losses and ohmic losses are fixed and only given by the specific design of the transistor, while in the circuit with the transistor arrangement 70 and the drive circuit 40 these losses can be adjusted dependent on the load condition by varying the number k of transistors $1_1$, $1_n$ that are in the first activation state and/or by varying the activated active area.

Like in the embodiments explained herein before, the number k and/or the activated active area can be adjusted dependent on measured load conditions, like load current or switching frequency. However, it is also possible to adjust k and/or the activated active area through an external control signal received by the drive circuit 40.

Figure 16:
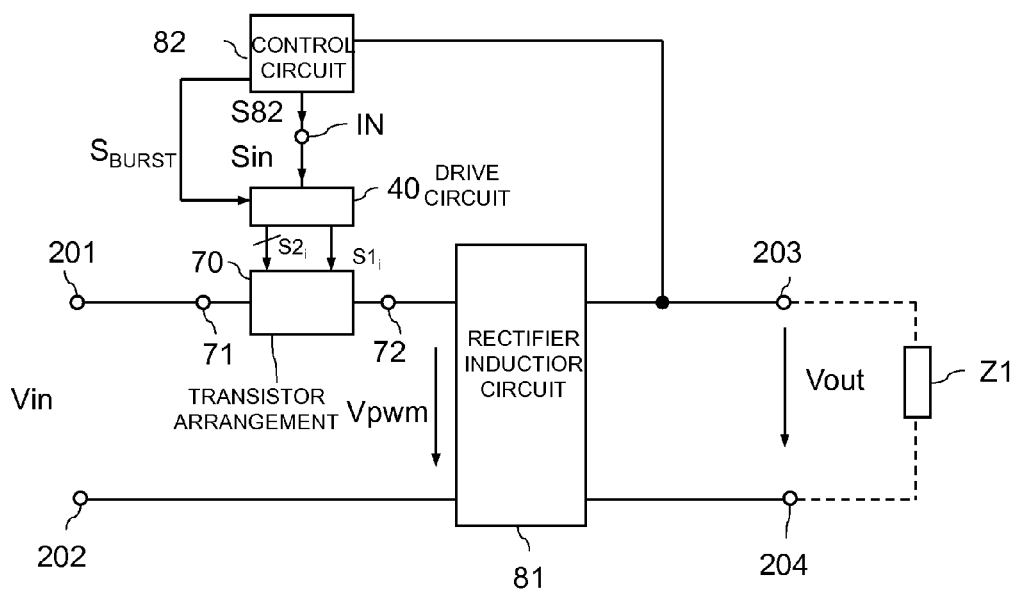
FIG. 16 illustrates an embodiment of a switching converter that includes a transistor arrangement as a switch.

According to one embodiment, the circuit is used as a switch in a switching converter. One embodiment of such a switching converter is schematically illustrated in FIG. 16. The switching converter includes input terminals 201, 202 for applying an input voltage Vin and output terminals 203, 204 for providing an output voltage Vout. The transistor arrangement 70 is connected to one of the input terminals and generates a pulse width-modulated voltage Vpwm which is received by a rectifier-inductor circuit 81. The rectifier-inductor arrangement 81 can be a conventional rectifier-inductor arrangement and includes at least on inductor, such as a choke, a transformer, a piezoelectric transformer, etc., and at least one rectifier element, such as a diode, a Schottky diode, a synchronous rectifier, etc.

A signal communication between the drive circuit 40 and the transistor arrangement 70 is only schematically illustrated in FIG. 16. The drive circuit 40 is configured to generate a control signal $S2_i$ for each of the transistors (not shown in FIG. 16) implemented in the transistor arrangement 70 and can be configured to generate one common drive signal S1 for the individual transistors or an individual drive signal $S1_i$ for each transistor.

The output voltage Vout of the switching converter is available at an output of the rectifier-inductor arrangement 81. The switching converter can be implemented as a conventional switching converter with a buck topology, a boost topology, a buck-boost topology, a flyback topology, etc. The type of the switching converter is defined by the topology of the rectifier-inductor arrangement 81. Rectifier-inductor topologies of conventional switching converters are commonly known, so that no further explanations are required in this regard.

Referring to FIG. 16, the switching converter further includes a control circuit 82 which receives the output voltage Vout and which is configured to provide a pulse width-modulated (PWM) drive signal S82. The drive signal S82 is received by the drive circuit 40 as input signal Sin. The drive signal S82 defines the switching frequency and a duty cycle of the switching operation of the transistor arrangement 70 and, therefore, defines the switching frequency and the duty cycle of the pulse width-modulated voltage Vpwm. The controller 82 can be a conventional controller used in switching converters and is configured to adjust the switching frequency and/or the duty cycle of the switching operation of the transistor arrangement 70 such that the output voltage Vout equals a given set-voltage. The control circuit 82 and the drive circuit 40 can be implemented in a common semiconductor body.

Figure 17:
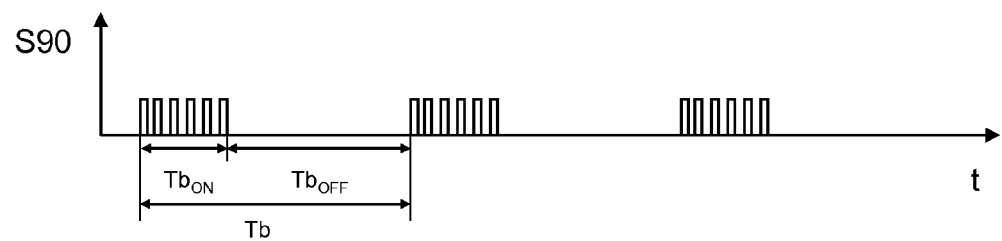
FIG. 17 illustrates the operating principle of the switching converter in a burst mode.

At low loads, i.e. when the power consumption of a load Z1 (illustrated in dashed lines in FIG. 16) is very low, the control circuit 82 is configured to operate the switching converter in a burst mode. In the burst mode the drive signal S82 includes a "burst" with signal pulses, where there are relatively long time periods between two bursts in which the transistor arrangement 70 is in its off-state. FIG. 17 schematically illustrates a timing diagram of the PWM drive signal S82 in the burst mode. In the burst mode there are subsequent burst periods Tb, where each burst period Tb includes a burst-on period $Tb_{ON}$ and a burst-off period $Tb_{OFF}$. During a burst-on period $Tb_{ON}$ the PWM drive signal includes a sequence of on-pulses, where the transistor arrangement 70 is to be switched on at each on-pulse. During a burst-off period $Tb_{OFF}$ the transistor arrangement 70 is switched off.

In the controller 82 a burst-mode signal $S_{BURST}$ is available that indicates whether the controller 82 and, therefore the switching converter, is in the burst mode or in a normal operation mode. Such a burst-mode signal is available in each controller that is capable of operating a switching converter in a burst mode or a normal operation mode, so that no further explanation is required in this regard.

According to one embodiment, the drive circuit 40 receives the burst-mode signal $S_{BURST}$ from the control circuit 82. The drive circuit 40 is configured to set the number k of transistors that are in the first activation state to be lower in the burst mode lower than in the normal operation mode. According to one embodiment, k=n in the normal operation mode, while k<n in the burst mode. According to one embodiment, k is between 0.1 times n and 0.5 times n in the burst mode. Instead of (only) varying the number k of transistors that may have the same size, it is also possible to vary the activated active area. According to one embodiment, the activated active area is smaller in burst mode lower than in the normal operation mode. According to one embodiment, the activated active area $A_{ACT}$ corresponds to the overall active area $A_{MAX}$, while $A_{ACT} < A_{MAX}$ in the burst mode. According to one embodiment, $A_{ACT}$ is between 0.1 times $A_{MAX}$ and 0.5 times $A_{MAX}$ in the burst mode.

In the embodiments explained hereinbefore, the drive circuit 40 is configured to drive each of the plurality of transistors in the first activation state and the second activation state. According to a further embodiment, there is a number m of transistors, where 0≤m<n, that are only driven in the first activation state, so that the drive circuit 40 is configured to selectively drive only a number n−m of the transistors in the first or second activation state, namely dependent on a load condition or, in a switching converter, dependent on the operation state.

Features explained with reference to a specific figure may be combined with features of other figures, even in those cases in which this has not explicitly been mentioned. Further, the methods described herein may be achieved in either all software implementations, using the appropriate processor instructions, or in hybrid implementations that utilize a combination of hardware logic and software logic to achieve the same results. Such modifications to the inventive concept are intended to be covered by the appended claims.

The concept explained hereinbefore can also be applied to IGBTs. An IGBT has an output capacitance Coss which is similar to that of a MOSFET at a gate-source voltage of zero (Vgs=0). In an IGBT, when it is in the on-state, the drift zone (base zone) is flooded with an electron-hole plasma which has the same effect as an increased output capacitance Coss in the on-state compared to an off state. Different concepts are known to control the density of minority charge carriers in the plasma using a control electrode that is additionally present to the gate electrode of the IGBT. These control electrodes are used to reduce the density of minority charge carriers of the charge carrier plasma at the time of switching off the IGBT or shortly before the time of switching off the IGBT.

Figure 18:
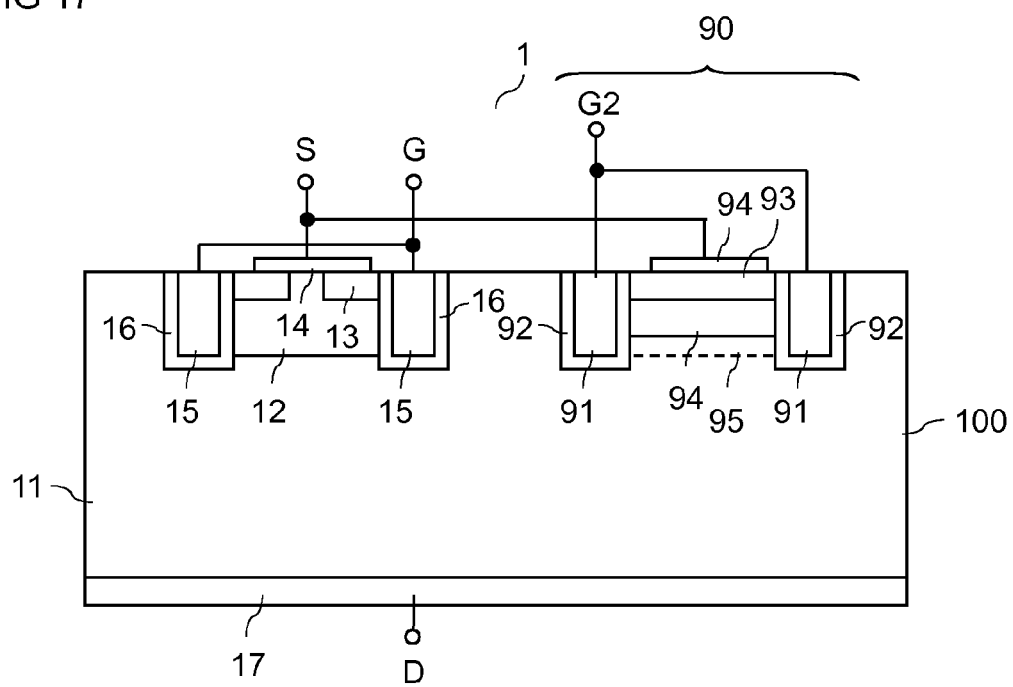
FIG. 18 illustrates an embodiment of an IGBT which has a voltage dependent output capacitance.

FIG. 18 illustrates an embodiment of an IGBT that includes a control structure 90 for controlling a minority charge carrier density in a drift region 11. The IGBT includes a source region 13 connected to a source terminal S (which is also referred to as emitter terminal), and a drain region 17 connected to a drain terminal D (which is also referred to as collector terminal). A field-stop region (not shown) may be arranged between the drift region 11 and the drain region 17.

The drain region 17 has a doping that is complementary to the doping of the drift region 11. Usually, the drift region is n-doped, while the drain region 17 is p-doped. The drift region 11 and the source region 13 have the same doping type, while the doping type of the body region 14 is complementary to the doping type of the drift region 11.

The IGBT further includes a drift region body region 12, where the body region 12 is arranged between the source region 13 and the drift region 11, and the drift region 11 is arranged between the body region 12 and the drain region 17. The source region 13, the body region 12, the drift region 11 and the drain region 17 are integrated in a semiconductor body 100. The IGBT according to FIG. 3 is implemented as a vertical MOSFET, which is an IGBT in which the source region 13 and the drain region 17 are arranged distant to one another in a vertical direction of the semiconductor body 100. In this case, a current essentially flows in a vertical direction through the semiconductor body 100 when the IGBT is in its on-state. However, implementing the IGBT as a vertical MOSFET is only an example. The basic principle explained below is also applicable to lateral MOSFETs in which the source and the drain regions are arranged distant to one another in a lateral direction of a semiconductor body.

The source region 13 and the body region 12 are both connected to a source electrode 14, with the source electrode 14 being connected to the source terminal S. This is common practice in IGBTs.

The IGBT further includes a gate electrode 15 connected to a gate terminal G. The gate electrode 15 is arranged adjacent the body region 17, where a gate dielectric 16 is arranged between the gate electrode 15 and the body region 12. In a commonly known manner the gate electrode 15 serves to control a first conducting channel in the body region 12 between the source region 13 and the drift region 11. In the embodiment illustrated in FIG. 3, the gate electrode 15 is a trench-electrode that borders the body and source 13, 14 regions in a lateral direction of the semiconductor body 100.

The IGBT is in its on-state, when an electrical potential applied to the gate terminal G is suitable for generating a first conducting channel along the gate dielectric 16 in the body region 12, and the IGBT is in its off-state, when there is no suitable drive potential at the gate terminal 15 for generating a conducting channel along the gate dielectric 16.

When the IGBT is in its on-state, the source region 13, via the conducting channel along the gate electrode 15, injects majority charge carriers into the drift region 11, and the drain region 17 injects minority charge carriers. The majority charge carriers are electrons when the source region 13 is n-doped and the minority charge carriers are holes when the drain region is p-doped. The majority and minority charge carriers form a charge carrier plasma in the drift region 11. This charge carrier plasma has to be removed from the drift region when the IGBT transitions from its on-state to its off-state. The IGBT is in its off-state when the conducting channel along the gate electrode is interrupted. In this case, there is a depletion region in the drift region 11 starting at the PN junction between the body region 14 and the drift region 11.

The control structure 90 is an MOS transistor structure with a second source region 93 and a second body region 94 arranged between the second source region 93 and the drift region 11. The second source region 93 has a doping type that is complementary to the doping type of the drift region 11, and the second body region 94 has the same doping type as the drift region 11. Optionally, a drain or collector region 95 of the same doping type as the second source region 93 is arranged between the second body region 94 and the drift region 11. The second source region 93 is electrically connected to the source or emitter electrode S of the IGBT via an electrode 96.

The control structure 90 acts like a MOSFET and can be switched on an off by applying a suitable drive potential via control terminal G2 to the control electrode 91. For explanation purposes it is assumed that the MOSFET of the control structure 90 is a p-MOSFET, which means that the second source electrode 93 is p-doped, while the second body region 94 and the drift region 11 are n-doped. This p-MOSFET is in its on-state, when a gate-source voltage applied between the control electrode and the second source region 93 is below a threshold voltage, and the p-MOSFET is in its off-state, when the drive potential is above the threshold voltage.

When the control structure 90 (or the p-MOSFET) is in its off-state, the IGBT according to FIG. 18 acts like a conventional IGBT. When, however, the control structure 90 is in its on-state and the IGBT is in its on-state, the control structure 90 provides a current path for minority charge carriers from the drift region 11 to the source or emitter terminal S, so that the minority charge carrier density in the drift region 11 is reduced when the control structure 90 is in its on-state. This reduction of minority charge carriers in the drift region 11 causes an increase of the on-resistance or the VCEsat, where VCEsat is the saturation voltage, of the IGBT. However, this reduction of the minority charge carrier density in the drift region 11 also reduces the output capacitance Coss of the IGBT. Thereby the number of minority charge carriers in the drift region 11 can e.g., be reduced by a factor of 2 while VCEsat increases by 10.50% Thus, the IGBT according to FIG. 18 can be operated in the same way as the MOSFETs explained herein before. In particular, it is possible to connect a plurality of IGBTs in parallel and to control the individual IGBTs, via their control terminals G2, to be in the first or second activation state dependent on a load condition of a circuit in which the IGBTs are employed.

The control structure 90 illustrated in FIG. 18 is only one possible example of a control structure that serves to control the minority charge carrier density in an IGBT. Any other control structure that controls the minority charge carrier density in an IGBT may be used as well.

Finally it should be mentioned that implementing the MOSFETs and IGBTs explained herein before to be vertical devices is only an example. These devices could also be implemented as lateral devices, which are devices in which source and drain regions are arranged distant to each other in a lateral direction of the semiconductor body. Further, it is also possible to implement the devices as vertical devices having a drain region implemented as a buried layer and to contact the buried drain region via a sinker from the same surface of the semiconductor body at which the source region is contacted.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement, comprising:
   a transistor arrangement comprising a plurality of n transistors, each comprising a gate terminal, and a load path between a source and a drain terminal, and m of the n transistors comprising:
   a drift region in the load path between a body region and the drain terminal; and
   a control terminal; and
   a field electrode arranged in a trench adjacent to and dielectrically insulated from the drift region; or
   a drift control region arranged within a semiconductor body adjacent to and dielectrically insulated from the drift region, and
   wherein the gate terminal of the m transistors is coupled to a gate electrode that is dielectrically insulated from the body region and is configured to control an on/off state of the m transistors by controlling a conducting channel in the body region between the source region and the drift region, and wherein the load paths of the plurality of n transistors are connected in parallel forming a load path of the transistor arrangement, where n is an integer number$\geq 2$ and m is an integer number$\leq$n and m$\geq 1$;
   wherein the control terminal of each m transistors is coupled to either the field electrode or the drift control region and is configured to receive a control signal that adjusts an activation state of the m transistors independent from the on/off state, and
   a drive circuit configured to independently adjust the activation state of the m transistors to one of a first activation state and a second activation state, to determine a load condition of the transistor arrangement, and to select k transistors that are driven to assume the first activation state and m−k of the m transistors that are driven to assume the second activation state dependent on the load condition, where k is an integer number$\leq$m an k$\geq 0$.

2. The circuit arrangement of claim 1, wherein each of the n transistors has an active area of identical size, and k is dependent on the load condition.

3. The circuit arrangement of claim 1, wherein each of the n transistors has an active area of different size, and the drive circuit is configured to select the k transistors that are in the first activation state such that a sum of the sizes of the active areas of the k transistors in the first activation state is dependent on the load condition.

4. The circuit arrangement of claim 1, wherein each of the m transistors has an output capacitance value and is configured to have a voltage dependency of this output capacitance value varied by the control signal.

5. The circuit arrangement of claim 4, wherein each of the m transistors has an on-resistance and is configured to have the on-resistance varied by the corresponding control signal.

6. The circuit arrangement of claim 5, wherein the control signal of each of the m transistors is selected such that the on-resistance is lower in the first activation state than in the second activation state.

7. The circuit arrangement of claim 6, wherein the load condition is dependent on a current flowing through the load path of the transistor arrangement, and the drive circuit is configured to determine a current flowing through the load path of the transistor arrangement, and to select the k transistors driven in the first activation state dependent on the determined current.

8. The circuit arrangement of claim 2, wherein the load condition is dependent on a current flowing through the load path of the transistor arrangement, and k increases with increasing current.

9. The circuit arrangement of claim 3, wherein the load condition is dependent on a current flowing through the load path of the transistor arrangement, and the sum of the sizes of the active areas of the k transistors in the first activation state increases with increasing current.

10. The circuit arrangement of claim 5, wherein the drive circuit is configured to determine a mean value or rms value of the current flowing through the load path of the transistor arrangement within a given time period, and to select the k transistors driven in the first activation state dependent on the determined mean or rms value.

11. The circuit arrangement of claim 1, wherein the drive circuit is further configured to provide at least one gate signal configured to switch the plurality of n transistors on or off.

12. The circuit arrangement of claim 11, wherein the drive circuit is configured to drive the plurality of n transistors to be switched on or to be switched off in common.

13. The circuit arrangement of claim 11, wherein the drive circuit is configured to permanently switch n−k transistors off.

14. The circuit arrangement of claim 1, the drive circuit is configured to cyclically switch on and off at least some of the plurality of m transistors, the load condition is dependent on a switching frequency of cyclically switching on and off the m transistors, and the drive circuit is configured to set the k transistors driven to assume the first activation state dependent on the switching frequency.

15. The circuit arrangement of claim 2, wherein the load condition is dependent on switching frequency at which the transistor arrangement is cyclically switched on and off, and k decreases with increasing switching frequency.

16. The circuit arrangement of claim 3, wherein the load condition is dependent on switching frequency at which the transistor arrangement is cyclically switched on and off, and the sum of the sizes of the active areas of the k transistors in the first activation state decreases with increasing switching frequency.

17. The circuit arrangement of claim 1, wherein the plurality of n transistors is implemented in one semiconductor body.

18. The circuit arrangement of claim 1, wherein the plurality of n transistors is implemented in at least two semiconductor bodies, and each of the m transistors is implemented in only one of the at least two semiconductor bodies.

19. The circuit arrangement of claim 1, wherein each of the n transistors has a control terminal and the drive circuit provides n drive signals.

20. The circuit arrangement of claim 1, wherein m of the n transistors comprise the drift control region, and wherein the drift control region extends along a complete length of the drift region in a vertical direction of the semiconductor body.

21. The circuit arrangement of claim 20, wherein the drift control region comprises a monocrystalline semiconductor material.

22. A circuit arrangement, comprising:
a transistor arrangement comprising a plurality of n transistors, each comprising a gate terminal, and a load path between a source and a drain terminal, and m of the n transistors comprising:
a drift region in the load path between a body region and the drain terminal; and
a control terminal; and
a field electrode arranged in a trench adjacent to and dielectrically insulated from the drift region; or
a drift control region arranged within a semiconductor body adjacent to and dielectrically insulated from the drift region; and
wherein the gate terminal of the m transistors is coupled to a gate electrode that is dielectrically insulated from the body region and is configured to control an on/off state of the m transistors, and wherein the load paths of the plurality of n transistors are connected in parallel forming a load path of the transistor arrangement, where n is an integer number≥2 and m is an integer number≤n and m≥1, wherein the control terminal of each m transistors is coupled to either the field electrode or the drift control region and is configured to receive a control signal that adjusts an activation state of the m transistors independent from the on/off state of the m transistors,
a drive circuit configured to independently adjust the activation state of the m transistors to one of a first activation state and a second activation state, to determine a load condition of the transistor arrangement, and to select k transistors that are driven to assume the first activation state and mk of the m transistors that are driven to assume the second activation state dependent on the load condition, where k is an integer number≤m and k≥0.

* * * * *

UNITED STATES PATENT AND TRADEMARK OFFICE
CERTIFICATE OF CORRECTION

PATENT NO. : 9,166,028 B2
APPLICATION NO. : 13/118993
DATED : October 20, 2015
INVENTOR(S) : F. Hirler et al.

It is certified that error appears in the above-identified patent and that said Letters Patent is hereby corrected as shown below:

Claims

Column 30, line 51 (claim 1, line 35) please change "m an k" to -- m and k --

Column 32, line 49 (claim 22, line 32) please change "and mk of" to -- and m-k --

Signed and Sealed this
Twenty-ninth Day of March, 2016

Michelle K. Lee
*Director of the United States Patent and Trademark Office*